(12) United States Patent
Goto et al.

(10) Patent No.: US 6,827,782 B2
(45) Date of Patent: Dec. 7, 2004

(54) CHEMICAL TREATING APPARATUS

(75) Inventors: Shigehiro Goto, Kyoto (JP); Katsushi Yoshioka, Kyoto (JP); Minobu Matsunaga, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 85 days.

(21) Appl. No.: 10/353,151

(22) Filed: Jan. 28, 2003

(65) Prior Publication Data

US 2003/0141314 A1 Jul. 31, 2003

(30) Foreign Application Priority Data

Jan. 31, 2002 (JP) ........................................ 2002-024103
Dec. 3, 2002 (JP) ........................................ 2002-351415

(51) Int. Cl.[7] .............................. B05B 7/16; B05C 11/00
(52) U.S. Cl. ........................ 118/667; 118/302; 118/323
(58) Field of Search ............................... 118/666, 667, 118/612, 52, 302, 323; 239/132.1

(56) References Cited

U.S. PATENT DOCUMENTS

| | | | |
|---|---|---|---|
| 2,114,661 A | 4/1938 | West | |
| 3,877,610 A | * 4/1975 | Dickey | 222/146.5 |
| 4,326,343 A | * 4/1982 | Rathmell | 34/558 |
| 6,170,709 B1 | 1/2001 | Huang | 222/146.5 |

FOREIGN PATENT DOCUMENTS

| | | |
|---|---|---|
| DE | 20004283 | 5/2000 |
| EP | 0475224 | 3/1992 |
| EP | 0486242 | 5/1992 |
| FR | 2495024 | 6/1982 |
| FR | 1115928 | 5/1996 |
| JP | 10256127 | 9/1998 |

* cited by examiner

Primary Examiner—Chris Fiorilla
Assistant Examiner—Yewebdar Tadesse
(74) Attorney, Agent, or Firm—Ostrolenk, Faber, Gerb & Soffen, LLP

(57) ABSTRACT

A chemical treating apparatus for performing a predetermined treatment of a principal surface of a substrate by delivering a treating solution thereto. The apparatus includes a treating solution delivery nozzle for delivering the treating solution to the principal surface of a substrate. The nozzle has a treating solution reservoir adjacent a tip end thereof for storing the treating solution. A temperature control device holds the treating solution reservoir to control the temperature of the treating solution in the treating solution reservoir through heat exchange with the treating solution.

20 Claims, 18 Drawing Sheets

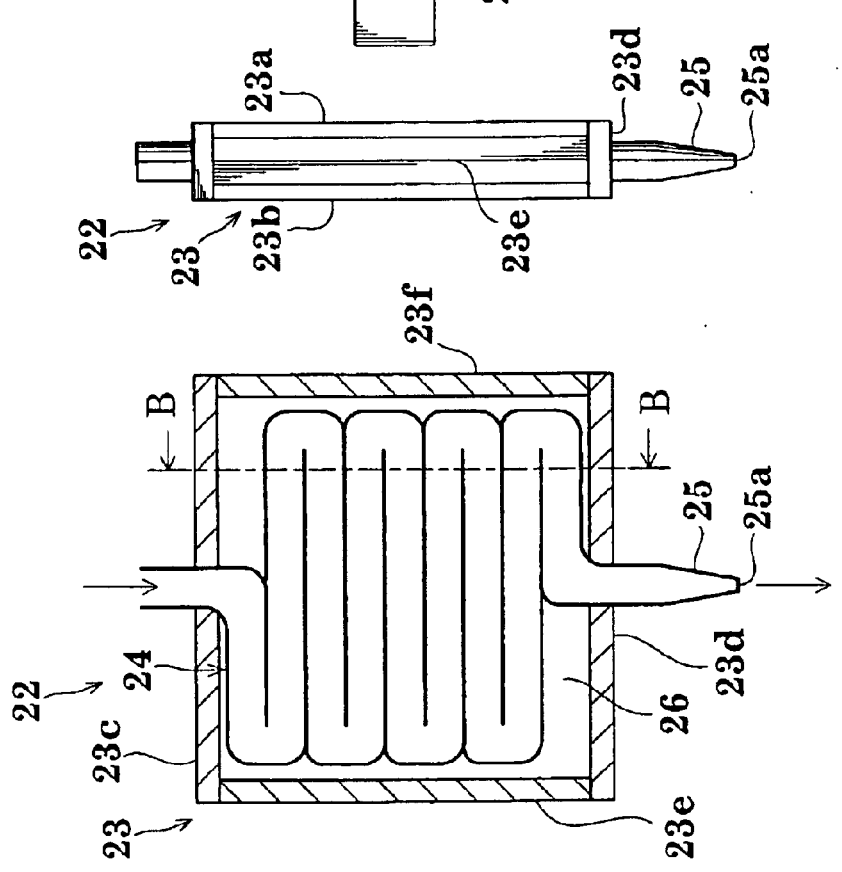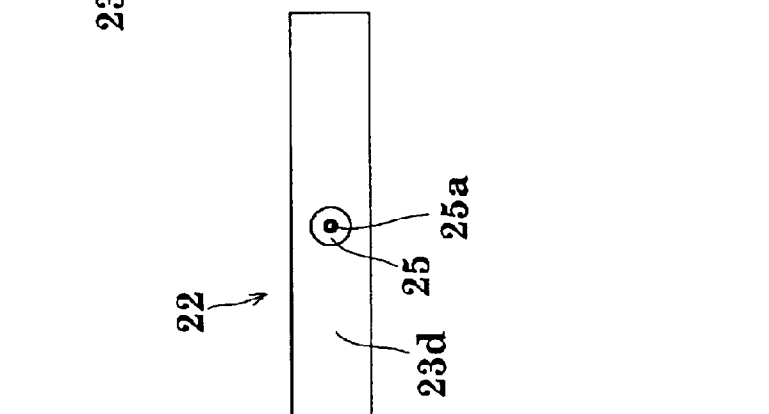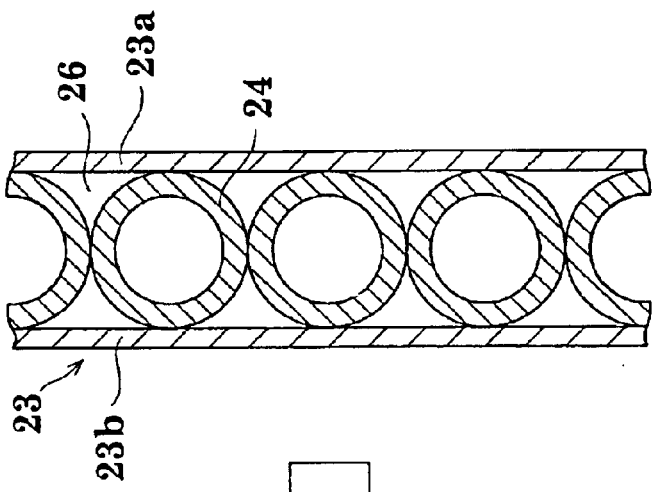

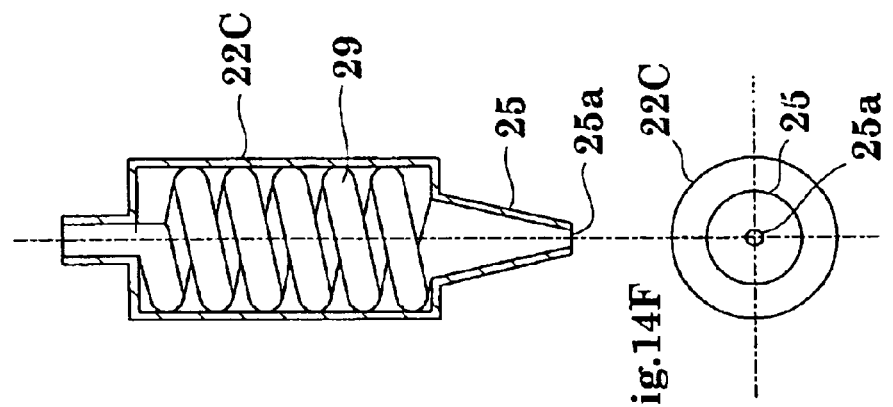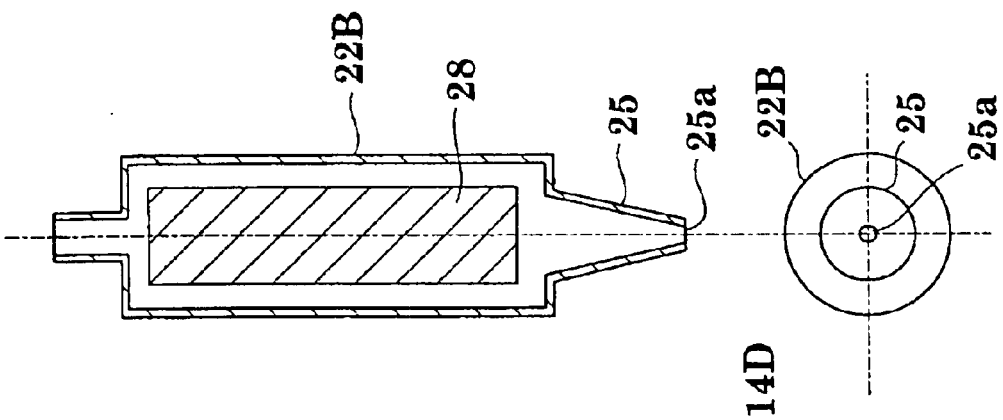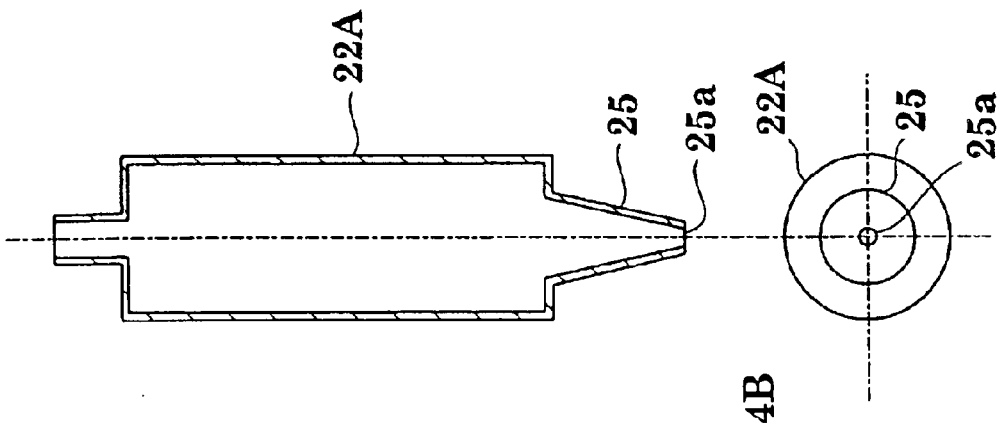

CHEMICAL TREATING APPARATUS

BACKGROUND OF THE INVENTION (1) Field of the Invention

This invention relates to chemical treating apparatus for performing a required treatment of substrates such as semiconductor wafers, glass substrates for photo masks, glass substrates for liquid crystal displays or substrates for optical disks, by supplying surfaces of the substrates with a treating solution such as a resist solution, developer or rinse solution. More particularly, the invention relates to a technique for controlling the temperature of a treating solution efficiently without enlarging an apparatus.

(2) Description of the Related Art

A known example of the chemical treating apparatus noted above is a spin coating apparatus which delivers a treating solution to the surface of a substrate to form a film thereon. The known spin coating apparatus will be described with reference to FIGS. 1 and 2. FIG. 1 is a sectional view of a treating solution supply arm 110 of the known spin coating apparatus. FIG. 2 is a side view of the known spin coating apparatus. As shown in FIGS. 1 and 2, this spin coating apparatus includes a turntable 100 for supporting and spinning a wafer W in horizontal posture, and the treating solution supply arm 110 for delivering a treating solution to the wafer W.

The treating solution supply arm 110 is connected at a proximal end thereof to a support block 111, and has a nozzle 112 attached to a distal end to be movable in X, Y and Z directions. The treating solution supply arm 110 has an arm portion 113 of triple pipe construction including a treating solution pipe 114, a temperature control pipe 115 and a metal pipe 116. The nozzle 112 is connected to the distal end of the treating solution supply arm 110 for delivering the treating solution to the wafer W. The treating solution pipe 114 is connected at a forward end thereof to the nozzle 112, and at the other end to a treating solution source (not shown).

Where the treating solution is a resist solution, for example, it is known that, depending on the temperature of the resist solution, the resist film formed on the wafer W is variable in thickness in the direction of the plane of wafer W. Thus, the spin coating apparatus has the temperature control pipe 115 surrounding the treating solution pipe 114 to adjust the temperature of the treating solution in the treating solution pipe 114.

Specifically, with the temperature control pipe 115 interposed between the treating solution pipe 114 and metal pipe 116, a forward passage 117 for temperature control water is formed between the treating solution pipe 114 and temperature control pipe 115, and a return passage 118 for the temperature control water between the temperature control pipe 115 and metal pipe 116. The temperature control water (i.e. water adjusted to a constant temperature) supplied from an external thermostatic tank is caused to flow through the forward passage 117 along the treating solution pipe 114 toward the nozzle 112, thereby to adjust the treating solution in the treating solution pipe 114 to a predetermined temperature. The temperature control water having reached the nozzle 112 is directed into the return passage 118 to flow back to the thermostatic tank. With this construction, the treating solution delivered from the nozzle 112 is adjusted to the predetermined temperature to form a film in uniform thickness over the surface of wafer W.

The conventional construction noted above has the following drawbacks.

Where, as shown in FIGS. 1 and 2, the temperature control water is circulated along the temperature control pipe 115 surrounding the treating solution pipe 114 having the nozzle 112 attached to the forward end, the large diameter of the temperature control pipe 115 allows only a limited curvature for the treating solution pipe 114 in time of movement of the nozzle 112. Consequently, a large vertical space is required above the wafer W, which rules out the possibility of making the apparatus vertically compact.

With an increasingly refined structure of semiconductor devices and larger diameter of substrates of recent years, new types of treating solutions have been developed and substrates are now supplied with a greater variety of treating solutions. Thus, it is necessary to provide a temperature control pipe 115 for every type of treating solution. Piping paths become complicated. The number of circulators must also be increased to adjust the temperature of the temperature control water in each temperature control pipe 115. All this requires an enlarged and complicated apparatus.

SUMMARY OF THE INVENTION

This invention has been made having regard to the state of the art noted above, and its object is to provide a chemical treating apparatus having a compact construction and yet is capable of controlling the temperature of a treating solution efficiently.

The above object is fulfilled, according to this invention, by a chemical treating apparatus for performing a predetermined treatment of a principal surface of a substrate by delivering a treating solution thereto, the apparatus comprising a treating solution delivery nozzle for delivering the treating solution to the principal surface of the substrate, the nozzle including a treating solution reservoir adjacent a tip end thereof for storing the treating solution, and a temperature control device for holding the treating solution reservoir to control temperature of the treating solution in the treating solution reservoir through heat exchange with the treating solution.

According to this invention, the treating solution reservoir adjacent the tip of the nozzle is held to control the temperature of the treating solution in the reservoir by heat exchange. The temperature-controlled treating solution in the reservoir is delivered to the substrate for treatment. It is therefore possible to dispense with the temperature control pipe extending along the treating solution pipe as provided in the conventional apparatus, thereby allowing the treating solution supply system to be compact. An effective heat exchange of the treating solution in the treating solution reservoir is provided to control the temperature of the treating solution efficiently.

Preferably, the temperature control device comprises a temperature control container for receiving the treating solution delivery nozzle, and holding the treating solution reservoir to control temperature of the treating solution in the treating solution reservoir through heat exchange with the treating solution.

With this construction, the temperature control container receives the treating solution delivery nozzle, and holds the treating solution reservoir to control the temperature of the treating solution in the treating solution reservoir through heat exchange with the treating solution. This construction dispenses with the temperature control pipe extending along the treating solution pipe as provided in the conventional apparatus, thereby allowing the treating solution supply system to be compact. An effective heat exchange of the treating solution in the treating solution reservoir is provided to control the temperature of the treating solution efficiently.

Preferably, the temperature control device comprises a nozzle temperature controlling and moving device for holding the treating solution reservoir to control temperature of the treating solution in the treating solution reservoir through heat exchange with the treating solution, and for moving the treating solution delivery nozzle to a predetermined position over the principal surface of the substrate while holding the treating solution reservoir.

With this construction, the nozzle temperature controlling and moving device moves the treating solution delivery nozzle to the predetermined position over the principal surface of the substrate while holding the treating solution reservoir. Thus, this construction dispenses with the temperature control pipe extending along the treating solution pipe as provided in the conventional apparatus, thereby allowing the treating solution supply system to be compact. An effective heat exchange of the treating solution in the treating solution reservoir is provided to control the temperature of the treating solution efficiently. Further, this construction is effective to avoid variations in the temperature of the treating solution in the treating solution reservoir occurring in the course of moving the nozzle to the predetermined position over the principal surface of the substrate.

In another aspect of the invention, a chemical treating apparatus is provided for performing a predetermined treatment of a principal surface of a substrate by delivering a treating solution thereto, the apparatus comprising a treating solution delivery nozzle including a treating solution reservoir adjacent a tip end thereof for storing the treating solution, and a temperature control device for contacting or approaching at least a major part of one of surfaces defining the treating solution reservoir to control temperature of the treating solution in the treating solution reservoir through heat exchange with the treating solution.

According to this invention, the temperature control device contacts or approaches at least a major part of one of the surfaces defining the treating solution reservoir to control the temperature of the treating solution in the treating solution reservoir through heat exchange. The temperature-controlled treating solution in the reservoir is delivered to the substrate for treatment. It is therefore possible to dispense with the temperature control pipe extending along the treating solution pipe as provided in the conventional apparatus, thereby allowing the treating solution supply system to be compact. Moreover, an effective heat exchange of the treating solution in the treating solution reservoir is provided to control the temperature of the treating solution efficiently.

The invention disclosed in this specification relates also to the following chemical treating method and chemical treating apparatus:

(1) A chemical treating method for performing a predetermined treatment of a principal surface of a substrate by delivering a treating solution thereto, the method comprising:

a storage step for storing the treating solution in a treating solution reservoir formed adjacent a tip of a treating solution delivery nozzle for delivering the treating solution to the principal surface of the substrate;

a temperature control step for holding the treating solution reservoir and controlling temperature of the treating solution in the treating solution reservoir through heat exchange with the treating solution; and a delivery step for delivering the treating solution temperature-controlled in said temperature control step to the principal surface of the substrate.

According to the above chemical treating method (1), the treating solution reservoir is held to control the temperature of the treating solution in the reservoir by heat exchange. The temperature-controlled treating solution in the reservoir is delivered to the substrate for treatment. It is therefore possible to dispense with the temperature control pipe extending along the treating solution pipe as provided in the conventional apparatus, thereby allowing the treating solution supply system to be compact. An effective heat exchange of the treating solution in the treating solution reservoir is provided to control the temperature of the treating solution efficiently.

(2) A chemical treating apparatus for performing a predetermined treatment of a principal surface of a substrate by delivering a treating solution thereto, the apparatus comprising:

a treating solution delivery nozzle for delivering the treating solution to the principal surface of the substrate, the nozzle including a treating solution reservoir adjacent a tip end thereof for storing the treating solution;

a temperature control container for receiving the treating solution delivery nozzle, and holding the treating solution reservoir to control temperature of the treating solution in the treating solution reservoir through heat exchange with the treating solution; and a standby container disposed below the temperature control container for receiving a discharge opening of the treating solution delivery nozzle lying in the temperature control container, and maintaining the discharge opening on standby in a predetermined atmosphere.

According to the above chemical treating apparatus (2) having the standby container disposed below the temperature control container, the containers may be installed without enlarging a horizontal area occupied by the chemical treating apparatus. The temperature of the treating solution in the treating solution reservoir may be controlled while the discharge opening is maintained on standby in the predetermined atmosphere inside the standby container.

(3) A chemical treating apparatus for performing a predetermined treatment of a principal surface of a substrate by delivering a treating solution thereto, the apparatus comprising:

a treating solution delivery nozzle for delivering the treating solution to the principal surface of the substrate, the nozzle including a treating solution reservoir adjacent a tip end thereof for storing the treating solution;

a standby container for receiving a discharge opening of the treating solution delivery nozzle, and maintaining the discharge opening on standby in a predetermined atmosphere; and a temperature control container provided separately from the standby container for receiving the treating solution delivery nozzle, and holding the treating solution reservoir to control temperature of the treating solution in the treating solution reservoir through heat exchange with the treating solution.

According to the above chemical treating apparatus (3), the discharge opening of the treating solution delivery nozzle may be maintained on standby in the predetermined atmosphere inside the standby container. The treating solution delivery nozzle to be used next is moved from the standby container into the temperature control container, so that the temperature of the treating solution in the treating solution reservoir may be controlled in the temperature control container. The temperature control container need not correspond in number to the standby container. It is sufficient if at least one temperature control container is provided. This avoids a complication of the apparatus due to a plurality of temperature control containers provided.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 6A is view in vertical section of the nozzle;

FIG. 6B is a side view of the nozzle;

FIG. 6C is a bottom view of the nozzle;

FIG. 6D is a sectional view of the nozzle taken on line B—B of FIG. 6A;

FIGS. 14A through 14F are sectional views and bottom views of modified treating solution reservoirs of the nozzle;

DESCRIPTION OF THE PREFERRED EMBODIMENTS

Preferred embodiments of this invention will be described in detail hereinafter with reference to the drawings.

<First Embodiment>

Figure 3:
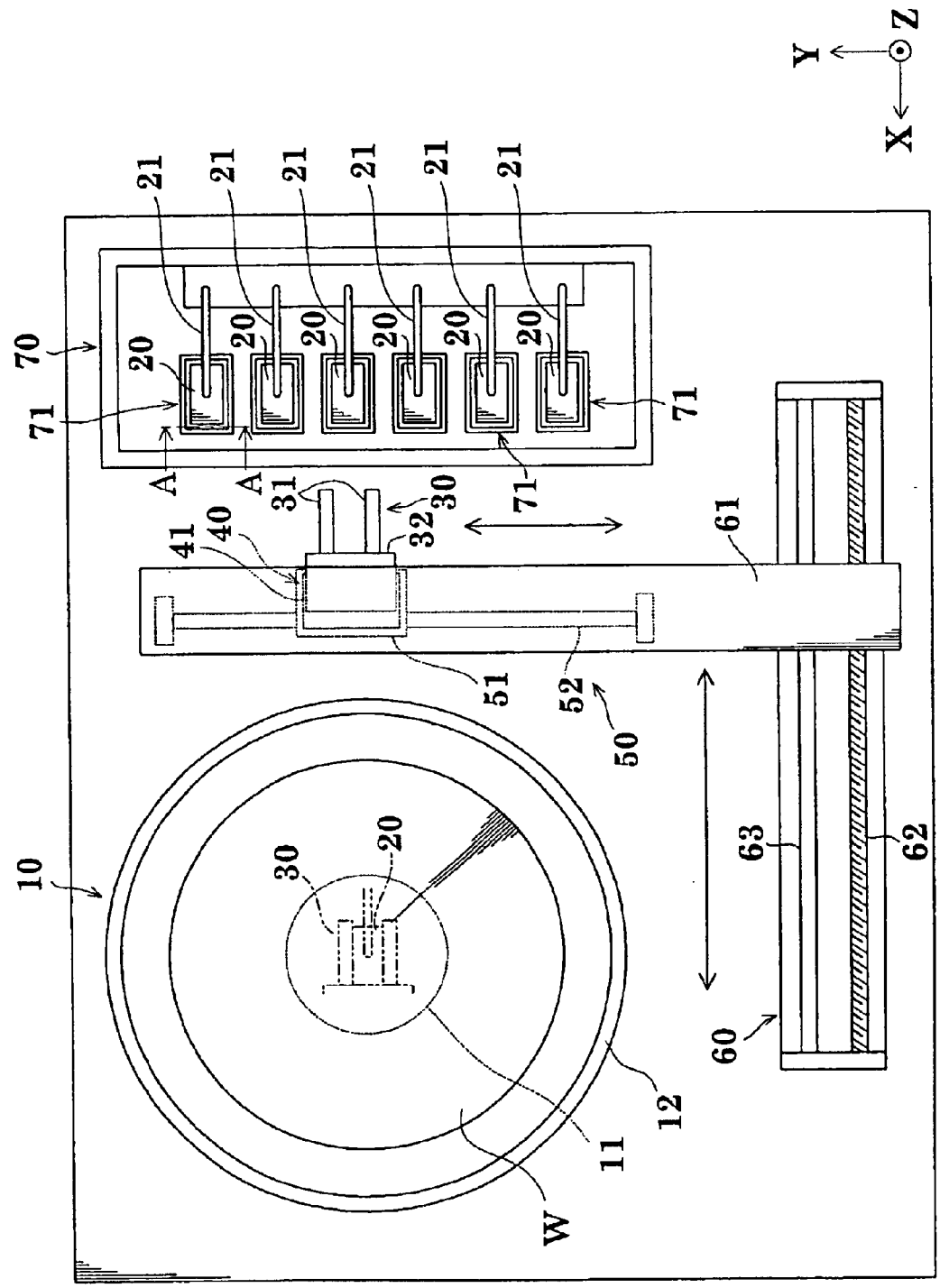
FIG. 3 is a plan view showing an outline of a spin coating apparatus which is a chemical treating apparatus in a first embodiment of the invention.
Figure 4:
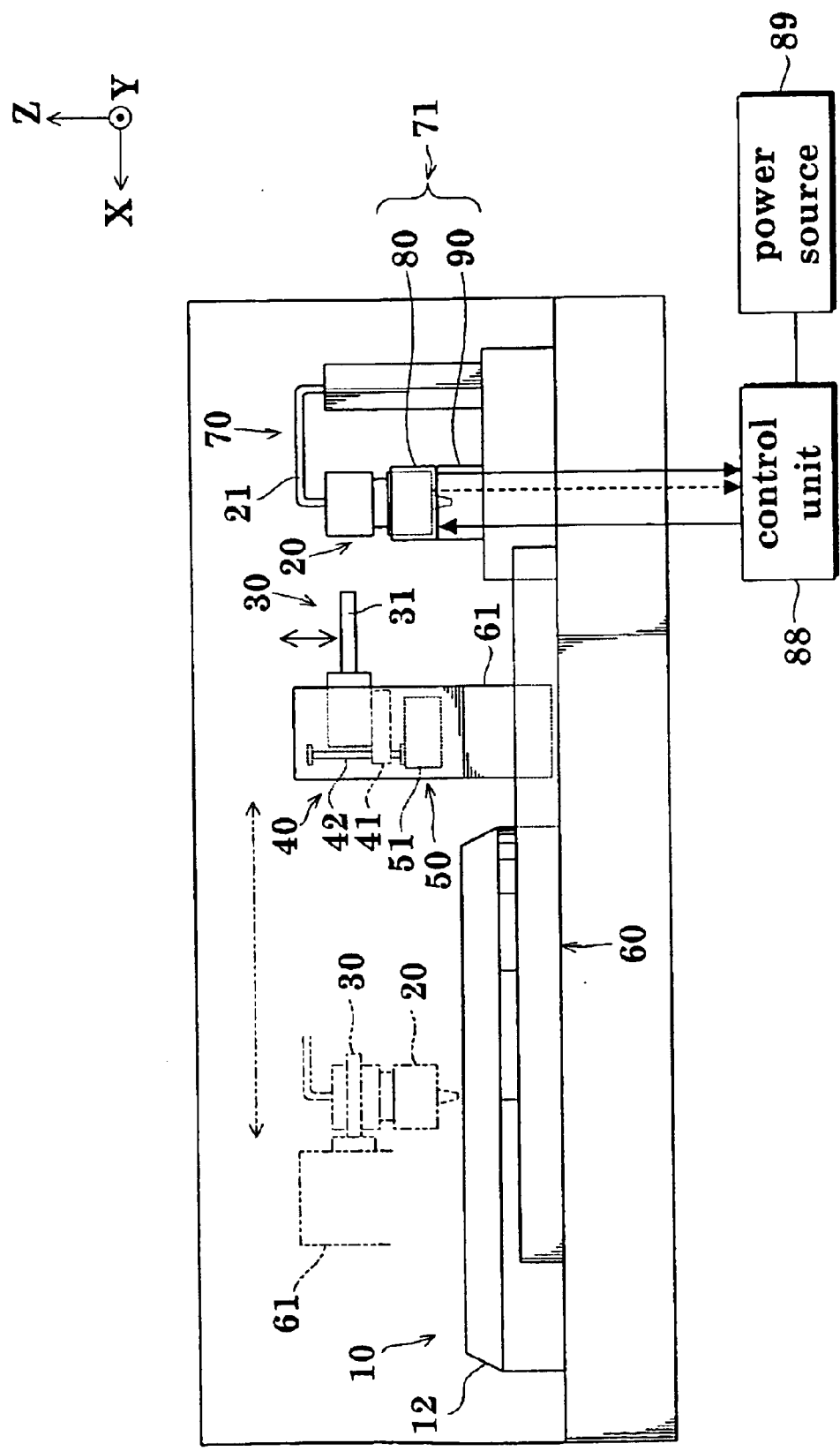
FIG. 4 is a side view of the chemical treating apparatus shown in FIG. 3.

FIG. 3 is a plan view showing an outline of a spin coating apparatus which is a chemical treating apparatus in a first embodiment of the invention. FIG. 4 is a side view of the apparatus.

In the first embodiment, a spin coating apparatus will be described as an example of chemical treating apparatus. The spin coating apparatus performs resist treatment of semiconductor wafers (hereinafter called simply "wafers") by delivering a resist solution as a treating solution to the wafers.

As shown in FIG. 3, the spin coating apparatus includes a spin treating station 10 for spin-coating a wafer W with the treating solution supplied thereto, a nozzle gripper 30 for gripping a nozzle 20 that delivers the treating solution, a vertical moving device 40 for moving the nozzle gripper 30 vertically (in directions of Z-axis), a Y-axis horizontal moving device 50 for moving the nozzle gripper 30 in directions of Y-axis, an X-axis horizontal moving device 60 for moving the nozzle gripper 30 in the directions of X-axis, and a standby station 70 for storing a plurality of (e.g. six in the first embodiment) nozzles 20.

The spin treating station 10 includes a turntable 11 for supporting and spinning the wafer W in horizontal posture, and a hollow scatter preventive cup 12 surrounding the turntable 11 for preventing the treating solution dispelled from the wafer W from scattering to the ambient. The scatter preventive cup 12 is vertically movable by a lift mechanism not shown. In time of spinning the wafer W, the scatter preventive cup 12 is raised to prevent the treating solution delivered to the wafer W from scattering outwardly of the cup 12. The treating solution scattering inside and received by the scatter preventive cup 12 is collected by a drain collecting structure, not shown, provided for the scatter preventive cup 12.

As shown in FIGS. 3 and 4, the plurality of (e.g. six) nozzles 20 for delivering different types of treating solution to the wafer W are stored in the standby station 70. In use, a selected one of the nozzles 20 is moved from the standby station 70 to a predetermined position over the wafer W in the spin treating station 10, and the treating solution is delivered from a discharge opening at the tip of nozzle 20 to the wafer W.

Figure 5A:
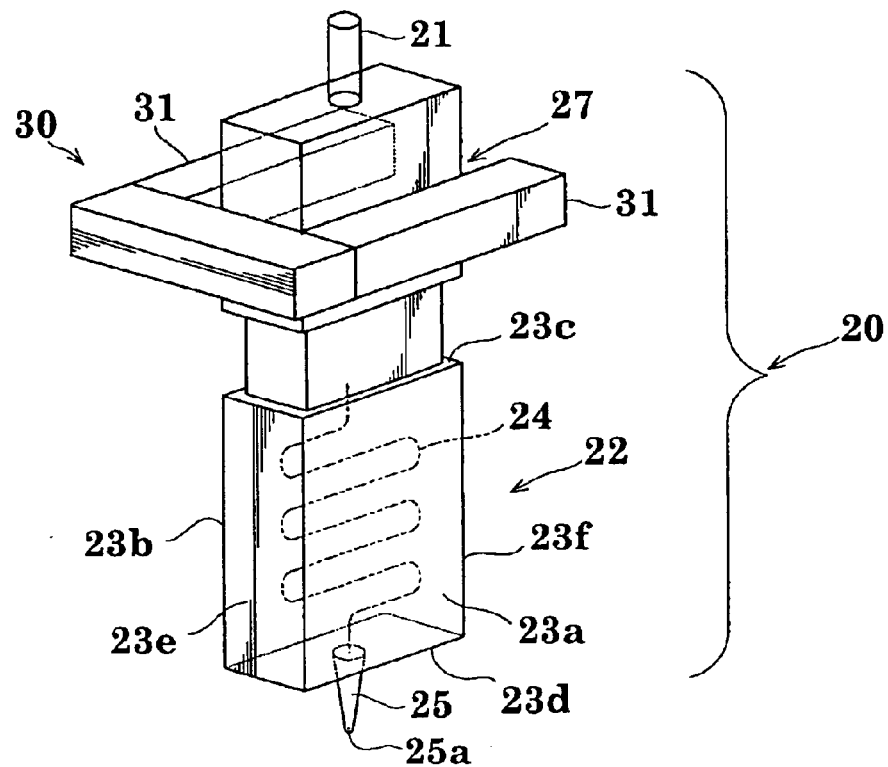
FIG. 5A is a schematic perspective view showing an outward appearance of a nozzle.
Figure 5B:
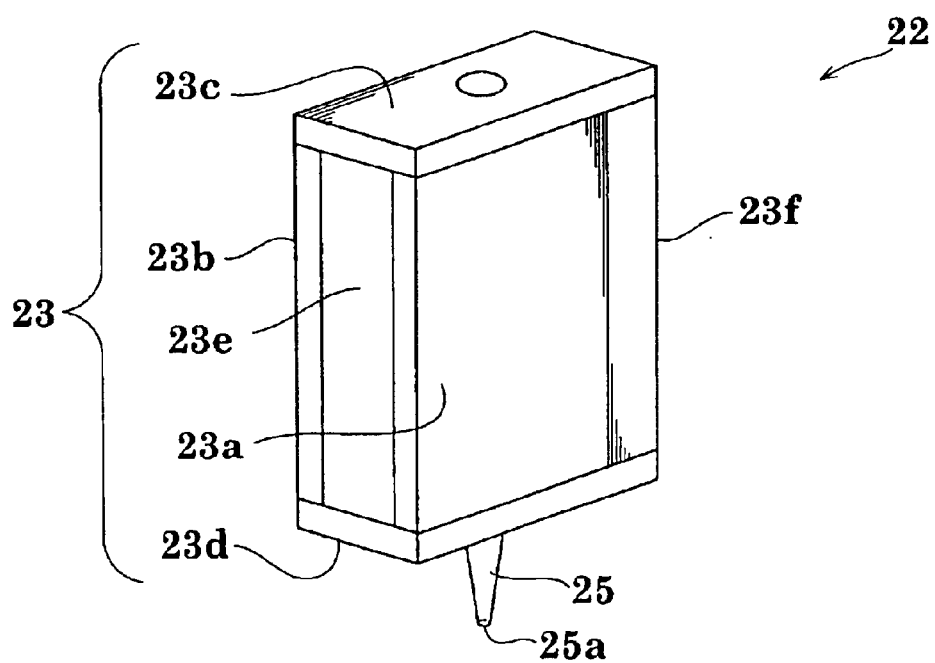
FIG. 5B is a schematic perspective view showing a temperature control surface of the nozzle.

This nozzle 20 will be described in detail with reference to FIGS. 5 and 6. FIG. 5A is a schematic perspective view showing an outward appearance of the nozzle 20. FIG. 5B is a schematic perspective view showing a temperature control surface of the nozzle 20. FIG. 6A is a view in vertical section of the nozzle 20. FIG. 6B is a side view of the nozzle 20. FIG. 6C is a bottom view of the nozzle 20. FIG. 6D is a sectional view of the nozzle 20 taken on line B—B of FIG. 6A.

As shown in FIG. 5A, the nozzle 20 has a reservoir 22 disposed adjacent the tip thereof for storing a fixed quantity of the treating solution supplied through a treating solution pipe 21. The treating solution reservoir 22 is sized to store the treating solution at least in a quantity to be used in a next delivery cycle. That is, the treating solution for one shot (e.g. 1 to 8 $cm^3$) to be delivered to the wafer W next is stored in the reservoir 22, and the treating solution is delivered from the reservoir 22 to the wafer W through a discharge opening 25a at the tip.

Specifically, as shown in FIG. 5B, the treating solution reservoir 22 of nozzle 20 has a plate type housing 23 formed of a heat conducting material and a heat insulating material. The housing 23 has a front plate 23a and a back plate 23b formed of the heat conducting material. Further, the housing 23 has a top plate 23c, a bottom plate 23d, a left side plate 23e and a right side plate 23f formed of the heat insulating material. The heat conducting material may be aluminum, copper or carbon, for example. When aluminum or copper is used as the heat conducting material, aluminum or copper portions contacting the treating solution are coated with a material highly resistant to chemicals (e.g. fluororesin coating). When carbon is used as the heat conducting material, carbon portions contacting the treating solution are coated with a material highly resistant to chemicals (e.g. diamond coating).

Referring to FIGS. 6A through 6C, the treating solution reservoir 22 of nozzle 20 is covered by the plate type housing 23 described above. As shown in FIG. 6A, the reservoir 22 is in the form of a meandering pipe 24 to have a large surface area per volume, thus defining a winding treating solution channel. The treating solution is stored in the meandering pipe 24, at least in a quantity to be used in a next delivery cycle. The treating solution reservoir 22 has a projection 25 formed at the lower end thereof and connected to the meandering pipe 24. The discharge opening 25a is formed at the tip of the projection 25 for delivering the treating solution. As shown in FIG. 6D, spaces between the housing 23 and meandering pipe 24 are filled with a highly heat conductive material 26.

As shown in FIG. 5A, the nozzle 20 has a grip portion 27 disposed adjacent a proximal end thereof, i.e. in a position above the treating solution reservoir 22, to be gripped by a pair of gripping arms 31 of nozzle gripper 30. The grip portion 27 of nozzle 20 is formed of a heat insulating material. The nozzle 20 is moved with the nozzle gripper 30 gripping the grip portion 27 of nozzle 20.

The above nozzle 20 corresponds to the treating solution delivery nozzle of this invention. The front plate 23a and back plate 23b of the treating solution reservoir 22 correspond to the heat exchange portions of this invention. The grip portion 27 corresponds to the engageable portion of this invention.

Figure 7:
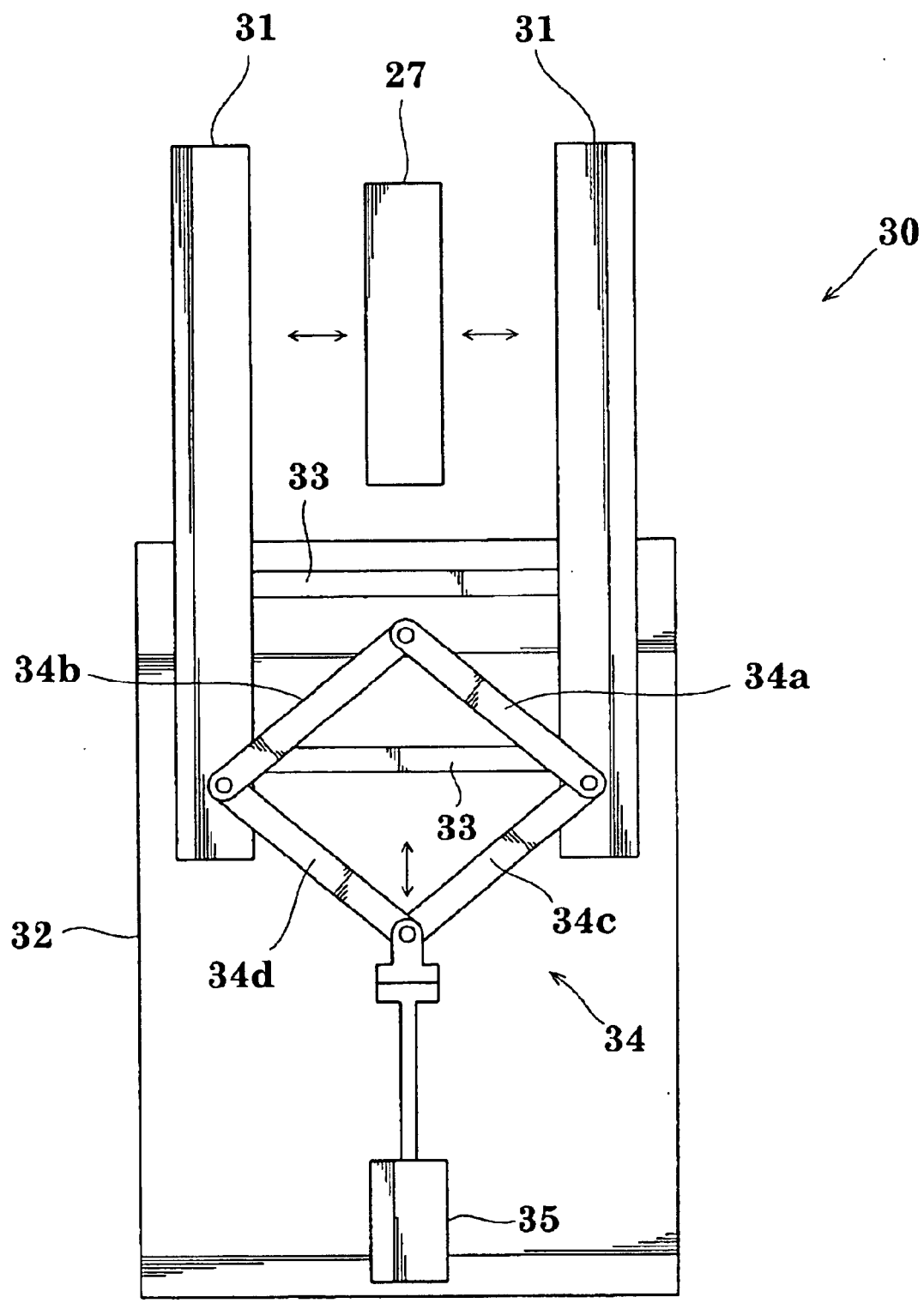
FIG. 7 is a plan view showing an outline of a nozzle gripper.

The nozzle gripper 30 will be described in detail with reference to FIG. 7. FIG. 7 is a plan view showing an outline of the nozzle gripper 30. The nozzle gripper 30 includes the pair of gripping arms 31 for gripping the grip portion 27 of nozzle 20. The gripping arms 31 are mounted to be movable toward and away from each other in the directions of Y-axis along rails 33 laid on the upper surface of a base 32.

Adjacent the proximal ends of the pair of gripping arms 31 are a link mechanism 34 for horizontally moving the gripping arms 31 toward and away from each other, and a drive cylinder 35 for actuating the link mechanism 34. The link mechanism 34 has a four-point link structure, with an end of a link 34a and an end of a link 34b pivotally connected, and a connection between a link 34c and a link 34d is connected to a rod of the drive cylinder 35. Further, a connection between the link 34b and link 34d and a connection between the link 34a and link 34c are attached to the gripping arms 31, respectively. When the rod of drive cylinder 35 is extended, the gripping arms 31 move away from each other to release the nozzle 20. When the rod of drive cylinder 35 is retracted, the gripping arms 31 approach each other to grip the grip portion 27 of nozzle 20.

As shown in FIGS. 3 and 4, the nozzle gripper 30 is attached to the vertical moving device 40 for moving the nozzle gripper 30 vertically (i.e. in the directions of Z-axis). The vertical moving device 40 includes a support member 41 for supporting the nozzle gripper 30, and a lifting mechanism 42 for vertically moving the support member 41.

The lifting mechanism 42 is connected to a horizontally movable member 51 of Y-axis horizontal moving device 50 for horizontally moving the nozzle gripper 30 in the directions of Y-axis. The horizontally movable member 51 has an end thereof engaged with a rotary screw 52 extending along Y-axis. The rotary screw 52 is rotatable by a drive motor not shown. Thus, the horizontally movable member 51 engaged with the rotary screw 52 reciprocates in the directions of Y-axis, whereby the vertical moving device 40 and nozzle gripper 30 also reciprocate in the directions of Y-axis.

Further, the Y-axis horizontal moving device 50 includes a slide plate 61 having one end thereof engaged with a rotary screw 62 of X-axis horizontal moving device 60 extending along X-axis. The rotary screw 62 is rotatable by a drive motor not shown. With rotation of the rotary screw 62, the slide plate 61 reciprocates along a guide 63 in the directions of X-axis, whereby the Y-axis horizontal moving device 50, vertical moving device 40 and nozzle gripper 30 also reciprocate in the directions of X-axis. The above nozzle gripper 30, vertical moving device 40, Y-axis horizontal moving device 50 and X-axis horizontal moving device 60 constitute the nozzle moving device of this invention.

As shown in FIG. 3, the standby station 70 includes, for example, six storage pots 71, described hereinafter, arranged along Y-axis. These storage pots 71, respectively, store the six nozzles 20 connected through treating solution pipes 21 to treating solution sources (not shown) for supplying the different types of treating solution. Each treating solution pipe 21 has an electromagnetic valve and a pump (not shown) connected thereto adjacent the treating solution source (not shown). Thus, a predetermined quantity of treating solution is supplied to the nozzle 20 through the treating solution pipe 21.

Figure 8A:
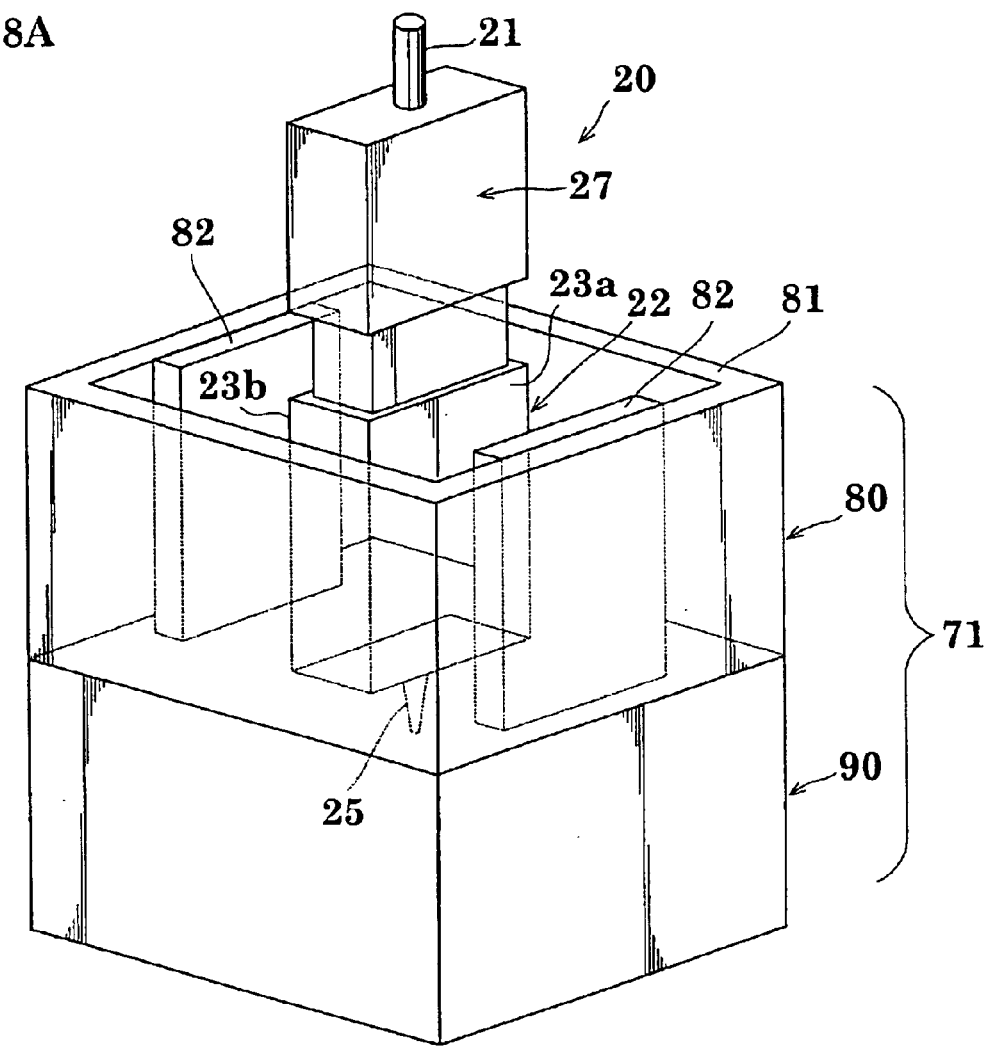
FIG. 8A is a schematic perspective view showing an outline of a storage pot.
Figure 8B:
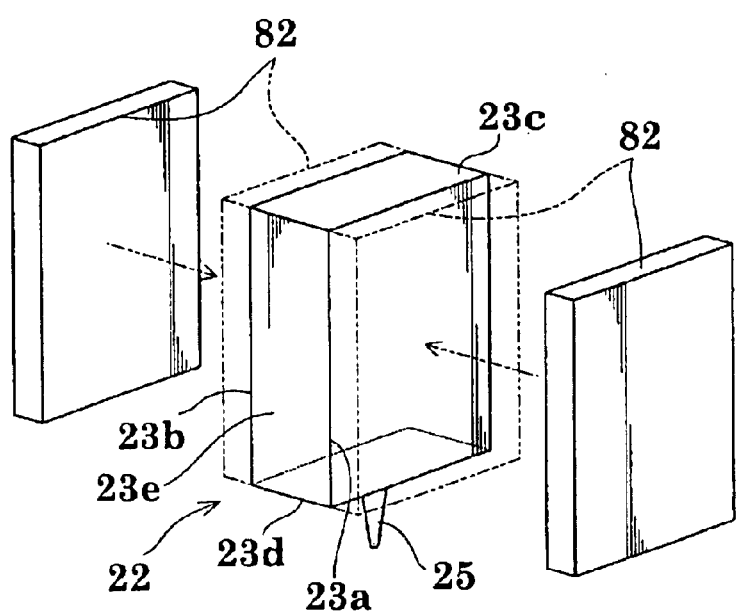
FIG. 8B is an explanatory view illustrating temperature control of a treating solution reservoir in the nozzle with temperature control portions of a temperature control pot.
Figure 9A:
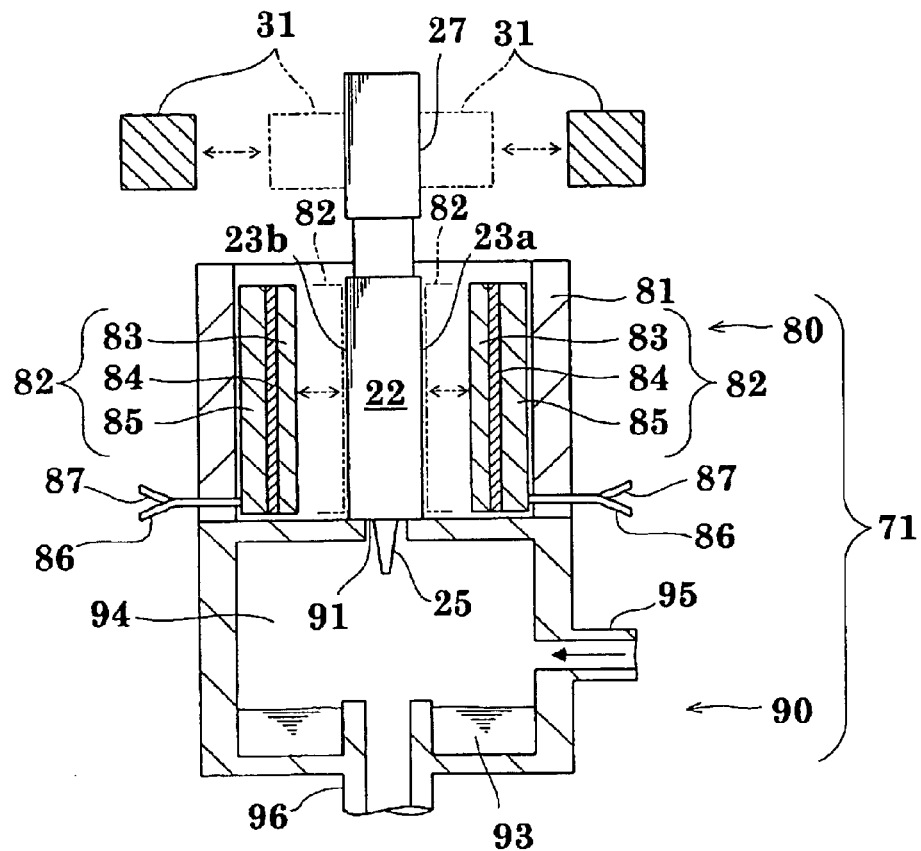
FIG. 9A is a sectional view of a storage pot taken on line A—A of FIG. 3.
Figure 9B:
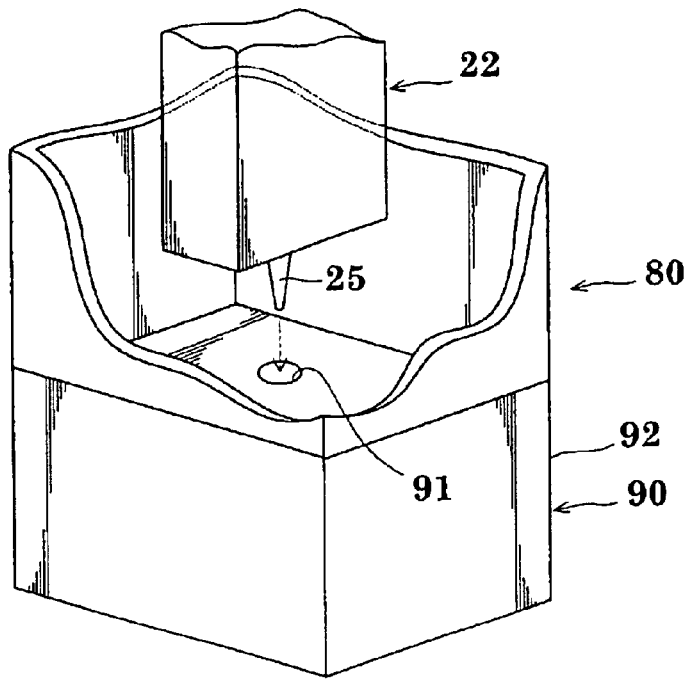
FIG. 9B is an explanatory view illustrating a projection of the nozzle lying in a standby pot when the nozzle is in the storage pot.

Next, the storage pots 71 will be described in detail with reference to FIGS. 8 and 9. FIG. 8A is a schematic perspective view showing an outline of a storage pot 71. FIG. 8B is an explanatory view illustrating temperature control of the treating solution reservoir 22 in the nozzle 20 with temperature control portions of a temperature control pot 80. FIG. 9A is a sectional view of the storage pot 71 taken on line A—A of FIG. 3. FIG. 9B is an explanatory view illustrating the projection 25 of the nozzle 20 lying in a standby pot 90 when the nozzle 20 is in the storage pot 71.

As shown in FIGS. 8A and 9A, each storage pot 71 includes a temperature control pot 80 for controlling the temperature of the treating solution reservoir 22 of nozzle 20, and a standby pot 90 for maintaining the projection 25 of nozzle 20 in a solvent atmosphere. The storage pot 71 has a two-stage construction with the temperature control pot 80 stacked on the standby pot 90.

The temperature control pot 80 will be described first. As shown in FIG. 8, the temperature control pot 80 includes a temperature control container body 81 for receiving the nozzle 20, and a pair of temperature control plates 82 arranged in the container body 81 for holding the treating solution reservoir 22 of nozzle 20 therebetween. The container body 81 is open at the top and bottom thereof. The nozzle 20 is moved into the container body 81 through the top opening. As shown in FIG. 8B, the pair of temperature control plates 82 are movable toward each other to hold the treating solution reservoir 22 in time of temperature control, and away from each other to release the reservoir 22 when the nozzle 20 is moved into or out of the container body 81. The temperature control plates 82 correspond in size to the heat exchange portions (i.e. front plate 23a and back plate 23b) of the treating solution reservoir 22. The temperature control plates 82 may be larger than the heat exchange portions of the treating solution reservoir 22. The temperature control plates 82 may be smaller than the heat exchange portions of the treating solution reservoir 22 as long as the temperature of the reservoir 22 is controlled with no problem.

As shown in FIG. 9A, the pair of temperature control plates 82 have pinching plates 83 attached to opposed surfaces thereof for contacting the treating solution reservoir 22. The pinching plates 83 have Peltier elements 84 attached to non-pinching surfaces thereof to act as thermoelectric cooling elements. The Peltier elements 84 can, by thermoelectric cooling effect, set the pinching plates 83 to a predetermined temperature in a short time. The Peltier elements 84 have cooling water circulating members 85 arranged on surfaces thereof facing away from the pinching plates 83 for supplying cooling water to remove heat generating from the Peltier elements 84. Each cooling water circulating member 25 has, connected to one end thereof, a cooling water supply pipe 86 for supplying cooling water into the circulating member 25, and a cooling water drain pipe 87 for draining the cooling water. The cooling water supply pipe 86 and cooling water drain pipe 87 are connected to a cooling water feeder (not shown) disposed outside.

As shown in FIG. 4, the spin coating apparatus has, disposed in predetermined positions inside, a control unit 88 for driving the Peltier elements 84, and a power source 89 for supplying a source voltage to the control unit 88. The temperature control plates 82 in each temperature control pot 80 have a temperature sensor (e.g. thermocouple), and the temperature of the temperature control pot 80 is transmitted from the temperature sensor to the control unit 88. The treating solution reservoir 22 of each nozzle 20 also has a temperature sensor (e.g. thermocouple), and the temperature of the treating solution in the treating solution reservoir 22 is transmitted from the temperature sensor to the control unit 88. Where the temperature sensor (e.g. thermocouple) of the treating-solution reservoir 22 is arranged to contact the treating solution, the sensor may be provided with a fluororesin coating, for example. The control unit 88 compares the temperature in the temperature control pot 80 and the temperature of the treating solution, and controls the temperature controlling power to the Peltier elements 84 of the temperature control plates 82 to set the treating solution to a predetermined temperature. A temperature difference may be determined by detecting the temperature of the temperature control pot 80 and the temperature of the treating solution, to perform temperature control at increased speed. It is also possible to detect a temperature closer to an actual temperature of the treating solution.

The nozzle 20 is placed in the temperature control pot 80 in time of temperature control. The pair of temperature control plates 82 pinch the treating solution reservoir 22 of nozzle 20 therebetween with a predetermined pressing force. That is, the temperature control plates 82 are placed in contact with the front plate 23a and back plate 23b of the treating solution reservoir 22 under increased contact pressure. The temperature of the treating solution in the treating solution reservoir 22 is controlled through heat exchange. The above temperature control pot 80 corresponds to the temperature control container of this invention.

The standby pot 90 disposed under the temperature control pot 80 will be described next. The standby pot 90 includes a standby container body 92 having a bore 91 formed in the upper surface thereof for receiving the projection 25 of nozzle 20. The projection 25 of nozzle 20 on standby is placed in a solvent atmosphere. The standby container body 92 defines a solvent sump 93 in a lower position thereof for storing a solvent, and a solvent space 94 above the solvent sump 93. A solvent supply pipe 95 is connected to the solvent space 94 for supplying the solvent. A drain pipe 96 is connected to a position of the standby container body 92 under the projection 25 of nozzle 20 for draining the treating solution dripping from the nozzle 20.

The receiving bore 91 of the standby pot 90 may be closed as appropriate in order to stop the solvent atmosphere flowing through the bore 91 into the temperature control pot 80 when the nozzle 20 is withdrawn from the storage pot 71.

Thus, when the nozzle 20 is placed in the storage pot 71 as shown in FIG. 9A, the pair of temperature control plates 82 in the temperature control pot 80 pinch the treating solution reservoir 22 therebetween. The Peltier elements 84 of the temperature control plates 82 adjust the temperature of the pinching plates 83 to a predetermined temperature, thereby controlling, by heat transfer, the temperature of the reservoir 22 pinched between the temperature control plates 82. In this way, the treating solution in the treating solution reservoir 22 of nozzle 20 on standby is maintained at a predetermined temperature. The projection 25 of nozzle 20 extends through the bore 91 of the standby pot 90 under the temperature control pot 80, to be maintained in the solvent atmosphere. The above standby pot 90 corresponds to the standby container of this invention.

Operation of the spin coating apparatus in the first embodiment will be described next. As shown in FIG. 3, the standby station 70 stores the plurality of (six in the first embodiment) nozzles 20 connected to the treating solution sources (not shown) which supply different types of treating solution through the treating solution pipes 21. These nozzles 20 are on standby and placed in the storage pots 71.

As shown in FIG. 8, each nozzle 20 placed the storage pot 71 has the treating solution supplied thereto through the treating solution pipe 21 from the treating solution source (not shown). The treating solution is stored in a predetermined quantity in the treating solution reservoir 22. Furthermore, this treating solution reservoir 22 is pinched between the pair of temperature control plates 82 in the temperature control pot 80. The control unit 88 compares the temperature in the temperature control pot 80 and the temperature of the treating solution in the treating solution reservoir 22. Based on a result of the comparison, the control unit 88 drives the Peltier elements 84 of the temperature control plates 82 to control the treating solution in the treating solution reservoir 22 to a predetermined temperature. The step of storing the treating solution in the treating solution reservoir 22 of nozzle 20 corresponds to the storage step of this invention. The step of pinching the treating solution reservoir 22 and controlling the temperature of the treating solution in the treating solution reservoir 22 by heat exchange corresponds to the temperature control step of this invention.

The spin coating apparatus selects a treating solution to be supplied to the wafer W according to predetermined treating conditions, and selects a corresponding nozzle 20. Once a nozzle 20 is selected, the vertical moving device 40, Y-axis horizontal moving device 50 and X-axis horizontal moving device 60 are driven to move the nozzle gripper 30, with the pair of gripping arms 31 opened, toward the grip portion 27 of the selected nozzle 20.

The pair of gripping arms 31 are driven to grip the grip portion 27 of nozzle 20. Then, the vertical moving device 40 is driven to raise the nozzle 20 gripped, and Y-axis horizontal moving device 50 and X axis horizontal moving device 60 are driven to move the nozzle 20 to the predetermined position over the wafer W, e.g. a position over the center of wafer W, in the spin treating station 10.

The nozzle 20 in the predetermined position over the wafer W delivers the treating solution in the treating solution reservoir 22 adjusted to the predetermined temperature to the surface of wafer W. Then, the wafer W is spun to spread the treating solution over the surface of wafer W. The temperature of the treating solution adjusted to a predetermined value effectively inhibits variations in thickness of a film due to an improper temperature of the treating solution. The step of delivering the temperature-controlled treating solution to the principal surface of the wafer corresponds to the delivery step of this invention.

Figure 1:
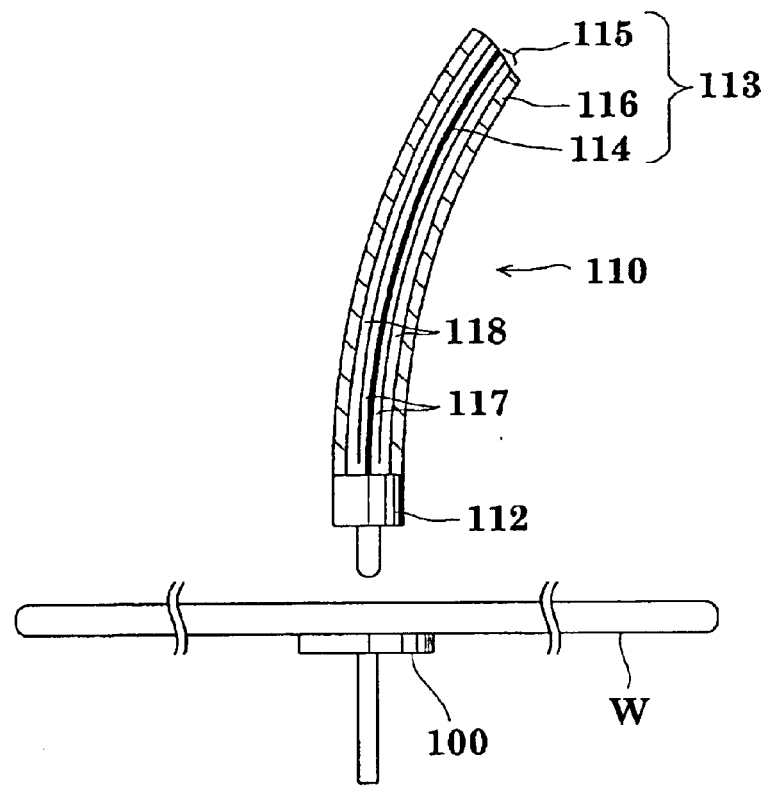
FIG. 1 is a sectional view showing a treating solution supply arm of a conventional spin coating apparatus.
Figure 2:
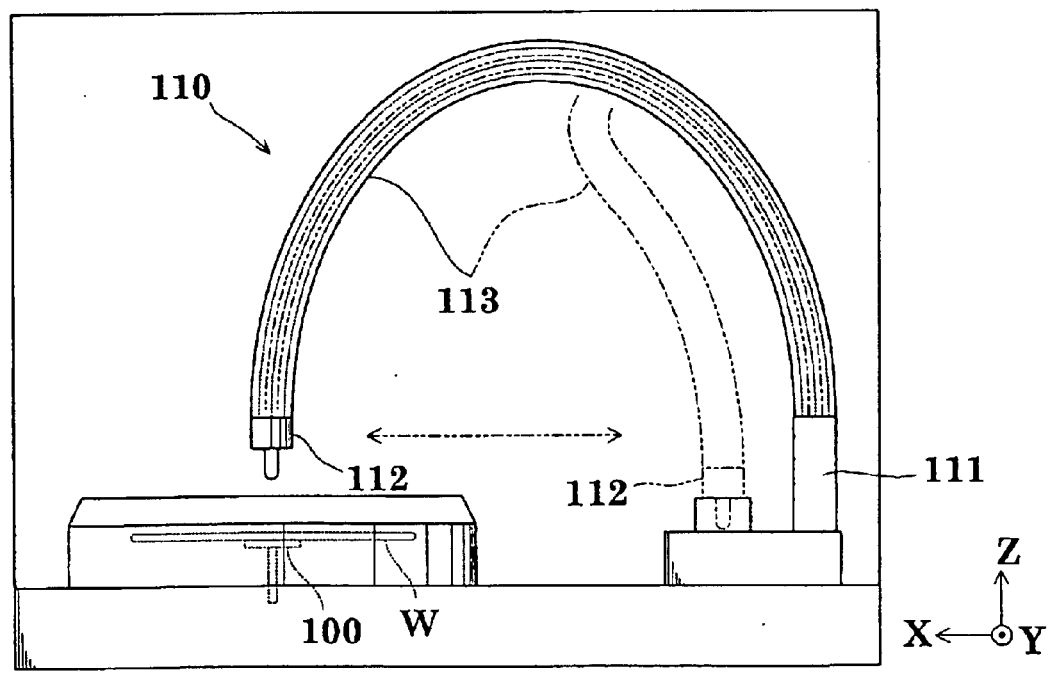
FIG. 2 is a side view of the conventional spin coating apparatus.

According to the spin coating apparatus in the first embodiment, as described above, the temperature control pot 80, with the nozzle 20 placed therein, pinches the treating solution reservoir 22, and controls the temperature of the treating solution in the reservoir 22 by heat exchange. This construction dispenses with the temperature control pipe 115 extending along the treating solution pipe 114 as provided in the conventional apparatus shown in FIG. 1. The apparatus in this embodiment requires only a small treating solution supply system, and provides an effective heat exchange of the treating solution in the treating solution reservoir 22 to control the temperature of the treating solution efficiently.

Specifically, while the conventional apparatus includes a temperature-controlling double pipe structure (with the temperature control pipe 115) in each treating solution system, the apparatus in this embodiment requires no such structure. The apparatus in this embodiment requires a reduced number of constructing steps and a reduced number of components. The pipes of the nozzles may have a reduced diameter, that is, only the treating solution pipes 21 may be provided. Each treating solution pipe 21 may have a large curvature in time of nozzle movement, whereby the apparatus may have reduced vertical dimensions. In the multiple nozzle system, the nozzles are arranged in the direction of Y-axis, for example. However, with the temperature-controlling double pipes now eliminated, the transverse spacing (in the direction of Y-axis) may be reduced.

In the conventional apparatus, constant temperature water is supplied to the temperature-controlling double pipe of each treating solution system, to control the temperature of several liters of water for temperature control of several cubic centimeters of treating solution to be delivered at a time. The apparatus in this embodiment controls only the temperature of several cubic centimeters of the treating solution in the treating solution reservoir 22. This remarkably reduces the power consumed in the temperature control. Since only the temperature of the treating solution in the treating solution reservoir 22 is controlled, a change in temperature may be effected in an extremely short time.

This apparatus includes the nozzle moving device (consisting of the nozzle gripper 30, vertical moving device 40, Y-axis horizontal moving device 50 and X-axis horizontal moving device 60) for holding a nozzle 20 and moving it to the predetermined position over the principal surface of wafer W. The nozzle 20 has the grip portion 27 to be gripped by the nozzle gripper 30, disposed in a position other than the heat exchange portions (front plate 23a and back plate 23b) of the treating solution reservoir 22 to be pinched in the temperature control pot 80, and the grip portion 27 is formed of a heat insulating material. Thus, the nozzle moving device never contacts the heat exchange portions, to reduce heat transfer between the nozzle moving device and the treating solution reservoir 22 and to reduce variations in the temperature of the treating solution in the reservoir 22.

The treating solution reservoir 22 is in the form of meandering pipe 24, for example. This configuration has an increased surface area per volume to expedite heat exchange.

Further, the treating solution reservoir 22 is sized to store the treating solution in a quantity to be used in a next delivery cycle. Heat exchange is effected speedily since this is done only for the minimum quantity of treating solution required for the next delivery.

<Second Embodiment>

Figure 10:
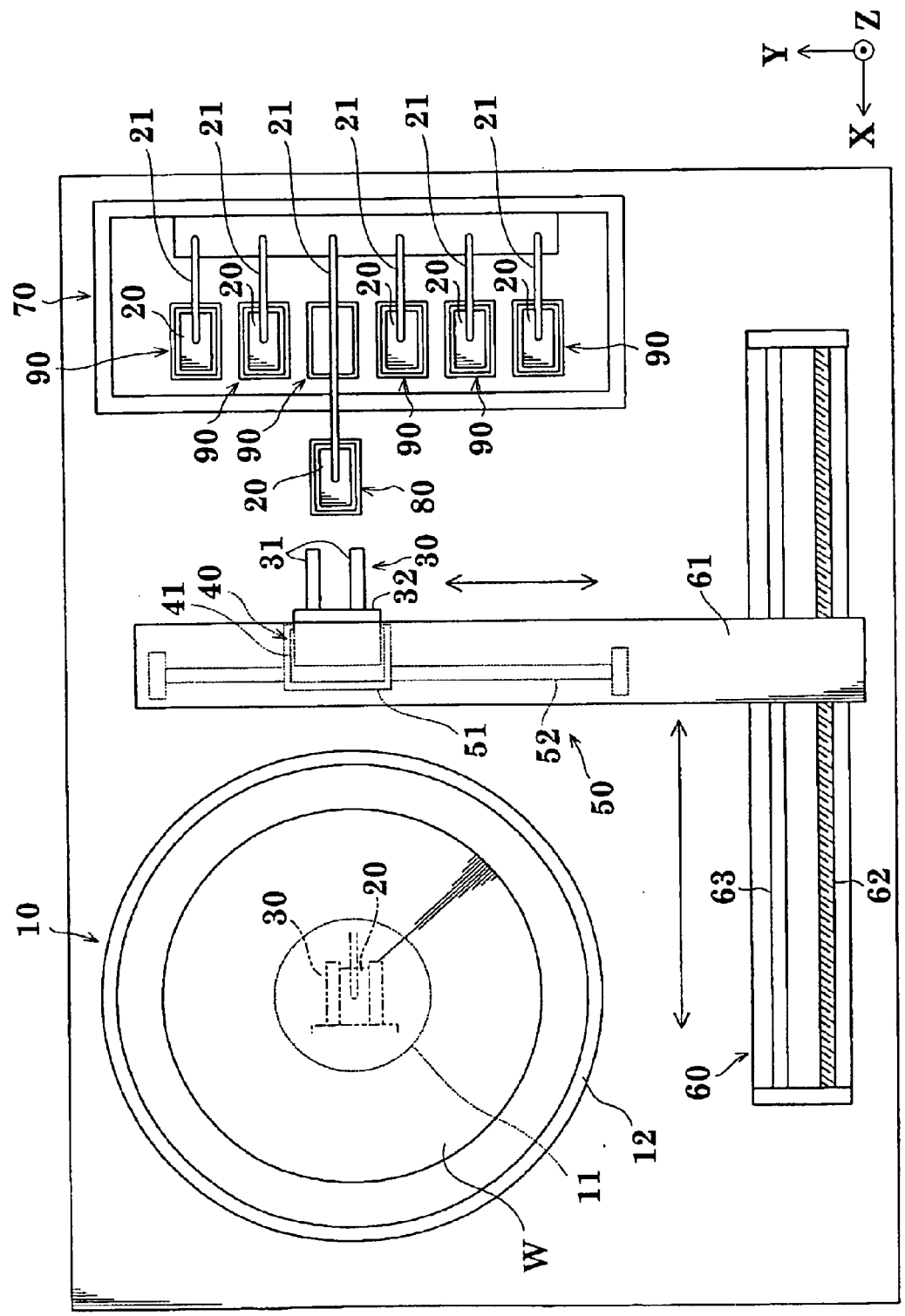
FIG. 10 is a plan view showing an outline of a spin coating apparatus which is a chemical treating apparatus in a second embodiment of the invention.

A second embodiment will be described with reference to FIG. 10. FIG. 10 is a plan view showing an outline of a spin coating apparatus which is a chemical treating apparatus in the second embodiment of the invention.

In the first embodiment described above, the standby station 70 includes six storage pots 71 each having the temperature control pot 80 and standby pot 90 arranged in two vertical stages. In this second embodiment, the standby station 70 includes six standby pots 90 only, with a single temperature control pot 80 disposed separately from the standby pots 90. Like reference numerals are used to identify like parts in the first embodiment and will not particularly be described again.

The spin coating apparatus in the second embodiment is characterized in that the single temperature control pot 80 is provided separately from the six standby pots 90.

Operation of the spin coating apparatus in the second embodiment will be described next. The standby station 70 stores six nozzles 20 connected to the treating solution sources (not shown) which supply different types of treating solution through the treating solution pipes 21. Each nozzle 20 is on standby, with the projection 25 extending through the receiving bore 91 of the standby pot 90.

As shown in FIG. 10, the nozzle gripper 30 grips one nozzle 20 selected from the six nozzles 20 on standby in the standby station 70, and places this nozzle 20 in the single temperature control pot 80. The temperature control pot 80 controls the temperature of the treating solution in the treating solution reservoir 22 of nozzle 20. After the temperature control of the treating solution in the reservoir 22 by the temperature control pot 80, the nozzle gripper 30 grips the nozzle 20 in the temperature control pot 80, and moves it to the predetermined position over the wafer W in the spin treating station 10. Then, the nozzle 20 delivers the temperature-controlled treating solution to the wafer W. After delivering the treating solution to the wafer W, the nozzle 20 is moved by the nozzle gripper 30 to the corresponding standby pot 90 in the standby station 70. The wafer W receives a predetermined treatment by the temperature-controlled treating solution.

According to the spin coating apparatus in the second embodiment, as described above, the discharge openings 25a of nozzles 20 may be kept on standby in the predetermined atmosphere in the standby pots 90, and a nozzle 20 selected for use is moved from its standby pot 90 to the temperature control pot 80. The temperature of the treating solution in the treating solution reservoir 22 may be controlled by the temperature control pot 80. There is no need to provide temperature control pots 80 corresponding in number to the standby pots 90. It is sufficient to serve the purpose if at least one temperature control pot 80 is provided. Thus, a complication of the apparatus resulting from providing a plurality of temperature control pots 80 may be avoided.

<Third Embodiment>

Figure 11:
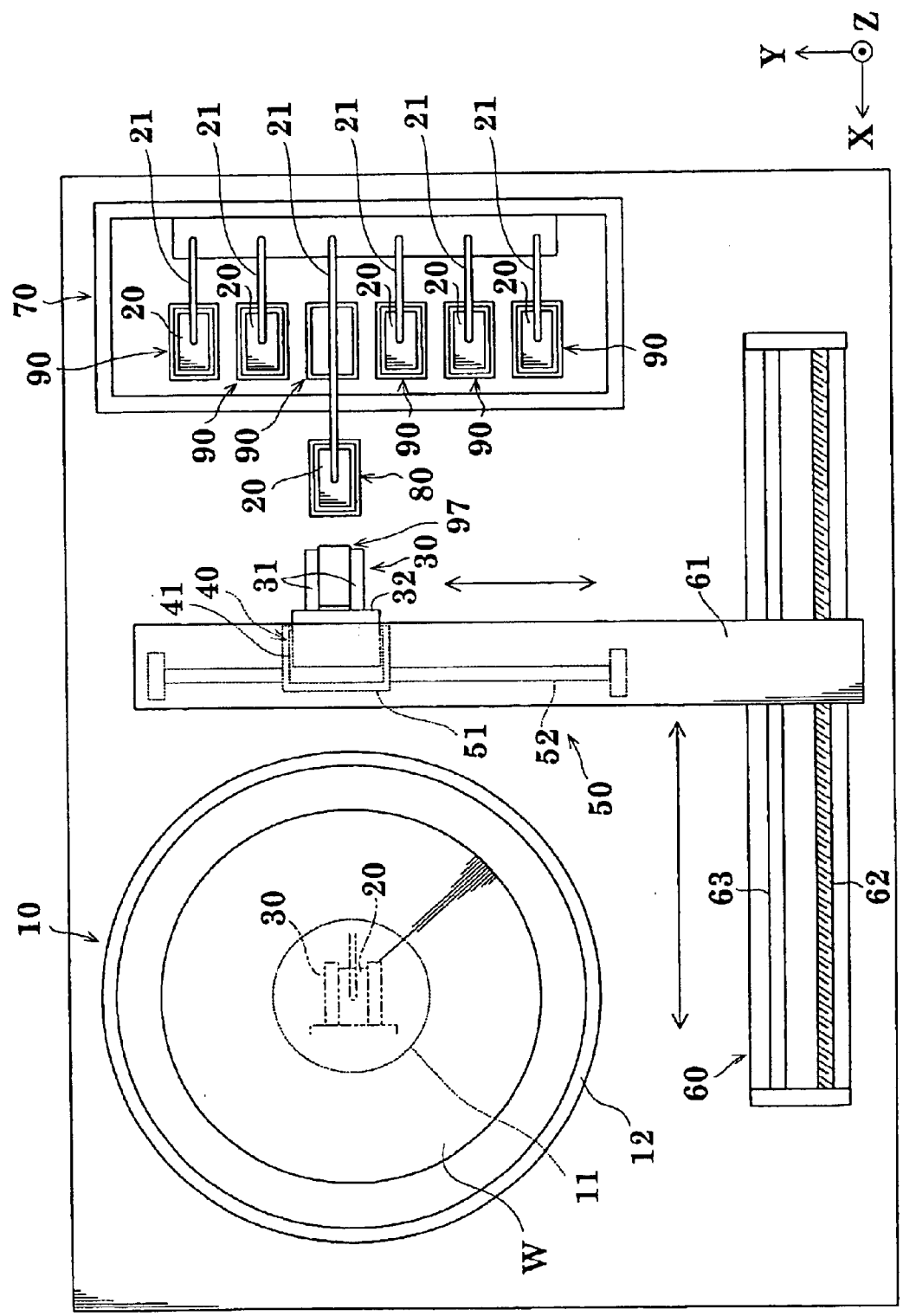
FIG. 11 is a plan view showing an outline of a spin coating apparatus which is a chemical treating apparatus in a third embodiment of the invention.
Figure 12:
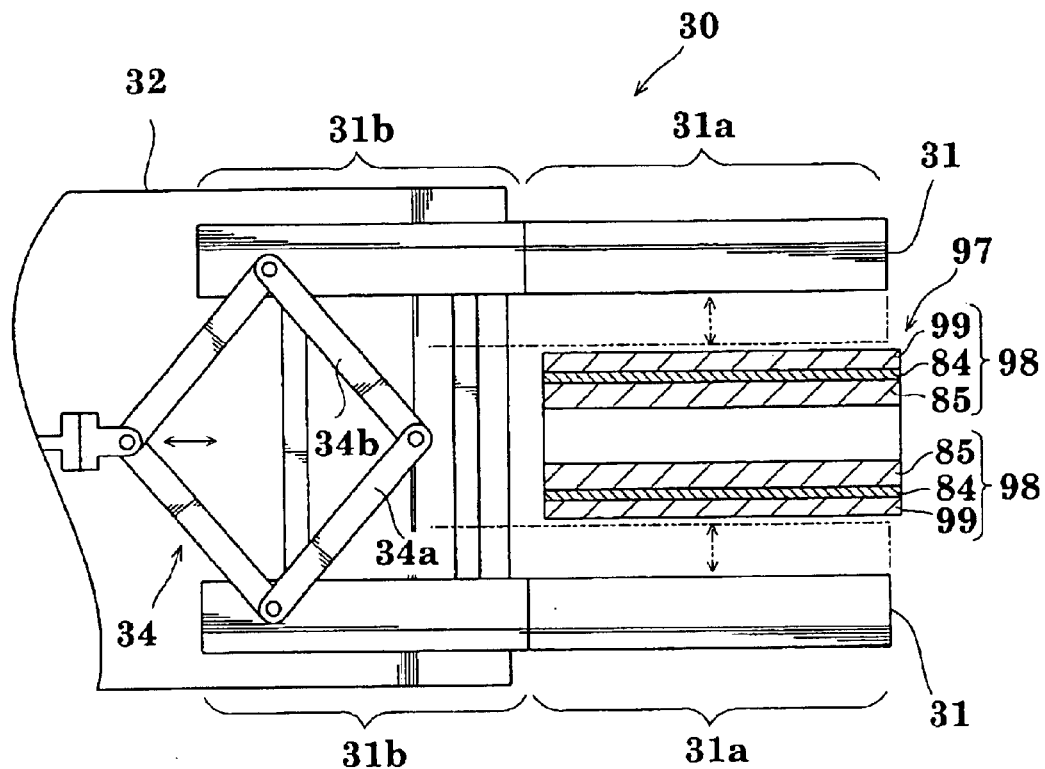
FIG. 12 is a plan view showing an outline of a gripping arm temperature control unit.
Figure 13:
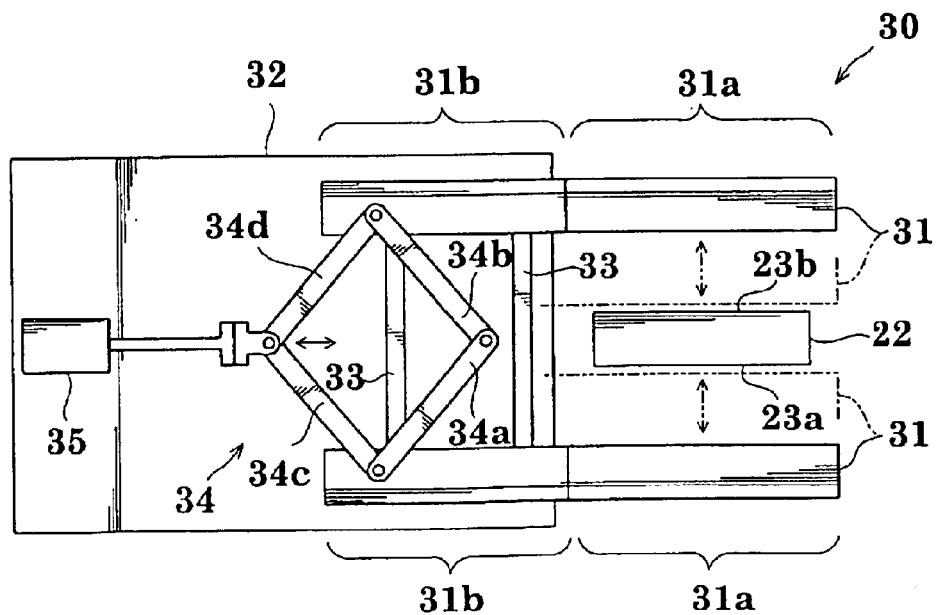
FIG. 13 is a plan view showing an outline of a nozzle gripper.

A third embodiment will be described with reference to FIGS. 11 through 13. FIG. 11 is a plan view showing an outline of a spin coating apparatus which is a chemical treating apparatus in the third embodiment of the invention. FIG. 12 is a plan view showing an outline of a gripping arm temperature control unit 97. FIG. 13 is a plan view showing an outline of a nozzle gripper 30.

In the second embodiment described above, the standby station 70 includes six standby pots 90, and the single temperature control pot 80 is provided separately from the standby pots 90. The nozzle gripper 30 grips the grip portion 27 of each nozzle 20. In the third embodiment, as shown in FIG. 11, a gripping arm temperature control unit 97 for controlling the gripping arms 31 of the nozzle gripper 30 is provided separately from the temperature control pot 80. As shown in FIG. 13, the gripping arms 31 of the nozzle gripper 30 grip the heat exchange portions (front plate 23a and back plate 23b) of the treating solution reservoir 22 of each nozzle 20. Like reference numerals are used to identify like parts in the first and second embodiments and will not particularly be described again.

The spin coating apparatus in the third embodiment is characterized in that, as shown in FIG. 11, the gripping arm temperature control unit 97 for controlling the gripping arms 31 of the nozzle gripper 30 is provided separately from the temperature control pot 80. As shown in FIG. 12, the gripping arm temperature control unit 97 includes a pair of temperature control plates 98 that contact the pair of gripping arms 31 of the nozzle gripper 30 for controlling the temperature of the gripping arms 31. Each temperature control plate 98 includes a contact plate 99 for contacting one of the gripping arms 31, and the same Peltier element 84 and cooling water circulating member 85 as in the first embodiment described hereinbefore. The above gripping arm temperature control unit 97 corresponds to the holder temperature control container of this invention.

As shown in FIG. 13, the pair gripping arms 31 include heat conducting members 31a for gripping the heat exchange portions (front plate 23a and back plate 23b) of the treating solution reservoir 22 of each nozzle 20, and heat insulating members 31b not for gripping the heat exchange portions, the heat conducting members 31a and heat insulating members 31b being connected to each other. This construction avoids heat transfer between the heat conducting members 31a and heat insulating members 31b. The pair of gripping arms 31 described above correspond to the holder of this invention.

Since the heat exchange portions (front plate 23a and back plate 23b) of the treating solution reservoir 22 of each nozzle 20 are gripped by the pair of gripping arms 31, the nozzle 20 in the third embodiment does not include the grip portion 27 shown in FIG. 5A.

Operation of the spin coating apparatus in the third embodiment will be described next. The standby station 70 stores six nozzles 20 connected to the treating solution sources (not shown) which supply different types of treating solution through the treating solution pipes 21. Each nozzle 20 is on standby, with the projection 25 extending through the receiving bore 91 of the standby pot 90.

As shown in FIG. 11, the nozzle gripper 30 grips the heat exchange portions (front plate 23a and back plate 23b) of the treating solution reservoir 22 of one nozzle 20 selected from the six nozzles 20 on standby in the standby station 70, and places this nozzle 20 in the single temperature control pot 80. After releasing the nozzle 20 in the temperature control pot 80, the nozzle gripper 30 is moved into the gripping arm temperature control unit 97. The pair of gripping arms 31 of the nozzle gripper 30 are placed in contact with the gripping arm temperature control unit 97. The temperature control pot 80 controls the treating solution in the treating solution reservoir 22 of nozzle 20 to a predetermined temperature. The gripping arm temperature control unit 97 controls the gripping arms 31 of the nozzle gripper 30 with the temperature control plates 98 to the same temperature as the treating solution in the treating solution reservoir 22.

After the temperature control of the treating solution in the treating solution reservoir 22 by the temperature control pot 80 and the temperature control of the gripping arms 31 of the nozzle gripper 30, the pair of gripping arms 31 of the nozzle gripper 30 grip the heat exchange portions (front plate 23a and back plate 23b) of the treating solution reservoir 22 of the nozzle 20 stored in the temperature control pot 80. The nozzle 20 is moved to the predetermined position over the wafer W in the spin treating station 10. Then, the nozzle 20 delivers the temperature-controlled treating solution to the wafer W. After delivering the treating solution to the wafer W, the nozzle 20 is moved by the nozzle gripper 30 to the corresponding standby pot 90 in the standby station 70. The wafer W receives a predetermined treatment by the temperature-controlled treating solution.

According to the spin coating apparatus in the third embodiment, as described above, the temperature of the treating solution reservoir 22 of nozzle 20 is controlled by the temperature control pot 80, and the pair of gripping arms 31 of the nozzle gripper 30 temperature-controlled by the gripping arm temperature control unit 97 hold the treating-solution reservoir 22 to move the nozzle 20 to the predetermined position over the principal surface of wafer W. This construction is effective to avoid variations in the temperature of the treating solution in the treating solution reservoir 22 occurring in the course of moving the nozzle 20 to the predetermined position over the principal surface of wafer W.

This invention is not limited to the first to third embodiments, but may be modified as follows:

(1) In the first and second embodiments described above, the grip portion 27 of each nozzle 20 is formed of a heat insulating material. A heat insulating member may be disposed between the treating solution reservoir 22 and grip portion 27 of nozzle 20, i.e. between the front plate 23a and back plate 23b acting as the heat exchange portions and the grip portion 27, to prevent heat transfer between the treating solution reservoir 22 and grip portion 27.

(2) In each of the foregoing embodiments, the wafer W is maintained in the fixed location while the nozzle 20 is moved. This invention is applicable also where the wafer W is moved from one location to another.

(3) In each of the foregoing embodiments, the standby station 70 includes six standby pots 90 for the six nozzle 20. Only one nozzle 20 or more than six nozzles 20 may be provided.

(4) In each of the foregoing embodiments, as shown in FIG. 6, the treating solution reservoir 22 of each nozzle 20 comprises the plate type. As shown in FIGS. 14A and 14B, a treating solution reservoir 22A in the shape of a round tube may be used. This treating solution reservoir 22A is shaped cylindrical. Further, as shown in FIGS. 14C and 14D, a treating solution reservoir 22B of double tube structure may be used. This treating solution reservoir 22B has a nest 28 mounted inside to provide an increased surface area per volume, with the treating solution stored adjacent outer walls. This construction realizes the heat exchange of the treating solution in the reservoir 22B carried out with increased effect. As shown in FIGS. 14E and 14F, a coil type treating solution reservoir 22C may be employed. This treating solution reservoir 22C has a helical pipe 29 to provide an increased surface area per volume for enabling the heat exchange of the treating solution in the reservoir 22B to be carried with increased effect.

(5) In each of the foregoing embodiments, as shown in FIG. 9A, the cooling water circulating members 85 are arranged adjacent the Peltier elements 84 of the temperature control plates 82 in the temperature control pot 81 in order to remove the heat generating from the Peltier elements 84. The cooling water circulating members 85 for supplying cooling water may be replaced by a cooling gas circulating device or cooling fins.

(6) In each of the foregoing embodiments, as shown in FIG. 9A, the temperature control surfaces (front plate 23a and back plate 23b) of nozzle 20 are directly contacted by the temperature control plates 82 in the temperature control pot 81. Instead, a gelatinous substance of high thermal conductivity or a magnetic fluid may be placed in an interface between the temperature control plates 82 and the temperature control surfaces of nozzle 20 contacting or adjacent each other to reduce a contact thermal resistance and to promote a heat exchange rate. Further, in the third embodiment, a gelatinous substance of high thermal conductivity or a magnetic fluid may be placed in an interface between the gripping arms 31 and the temperature control plates 82 contacting or adjacent each other to reduce a contact thermal resistance and to promote a heat-exchange rate.

Figure 15:
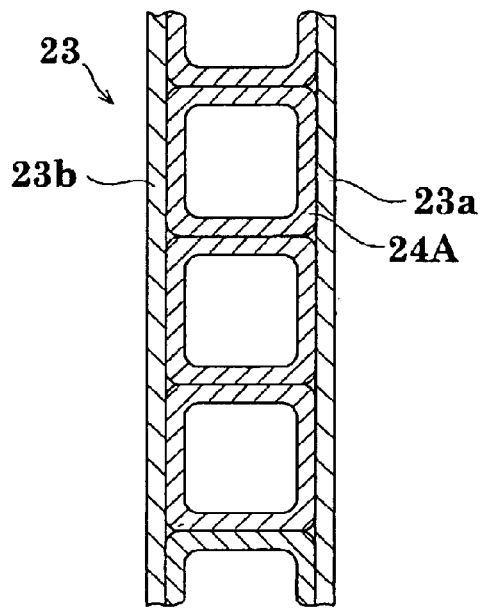
FIG. 15 is a sectional view of a modified treating solution reservoir.

(7) As shown in FIGS. 6A and 14D, the treating solution reservoir 22 in each of the foregoing embodiments has a highly heat-conductive material 26 filling the spaces between the housing 23 and the meandering pipe 24 with a circular cross section. As shown in FIG. 15, a meandering pipe 24A with a square cross section may be employed to eliminate the spaces between the housing 23 and the internal pipe, i.e. the spaces to be filled with the highly heat-conductive material 26.

Figure 16:
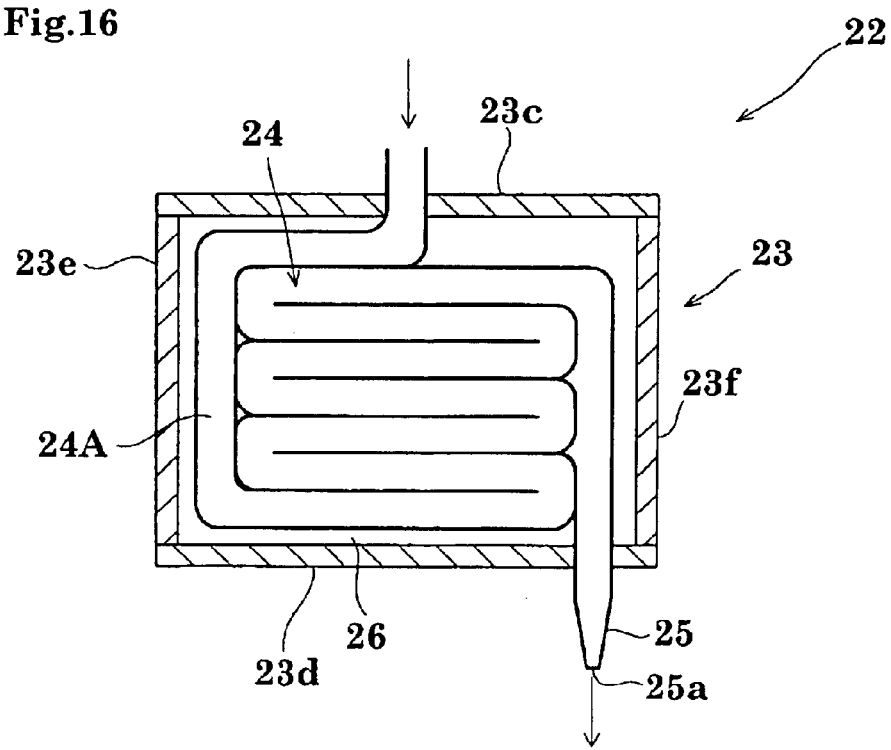
FIG. 16 is a sectional view of another modified treating solution reservoir.

(8) In each of the foregoing embodiments, as shown in FIG. 6A, the meandering pipe 24 in the treating solution reservoir 22 defines a treating solution channel following a winding course from top to bottom. Alternatively, as shown in FIG. 16, the treating solution reservoir 22 may include a channel 24A that directs the treating solution to a lower position, then to an upper position higher than the lower position, and again downward to be delivered from the discharge opening. With the meandering pipe 24 in the treating solution reservoir 22 shown in FIG. 6A, the treating solution could fall by gravity faster than an intended feed rate, and inadvertently draw air into the pipe 24. In the construction shown in FIG. 16, the channel 24A allows the treating solution to flow to the lower position in the reservoir 22 once, and flow upward therefrom. This flow mode can reduce the possibility of air mixing into the treating solution. This construction is applicable also to the various treating solution reservoirs shown in FIGS. 14A through 14F.

Figure 17:
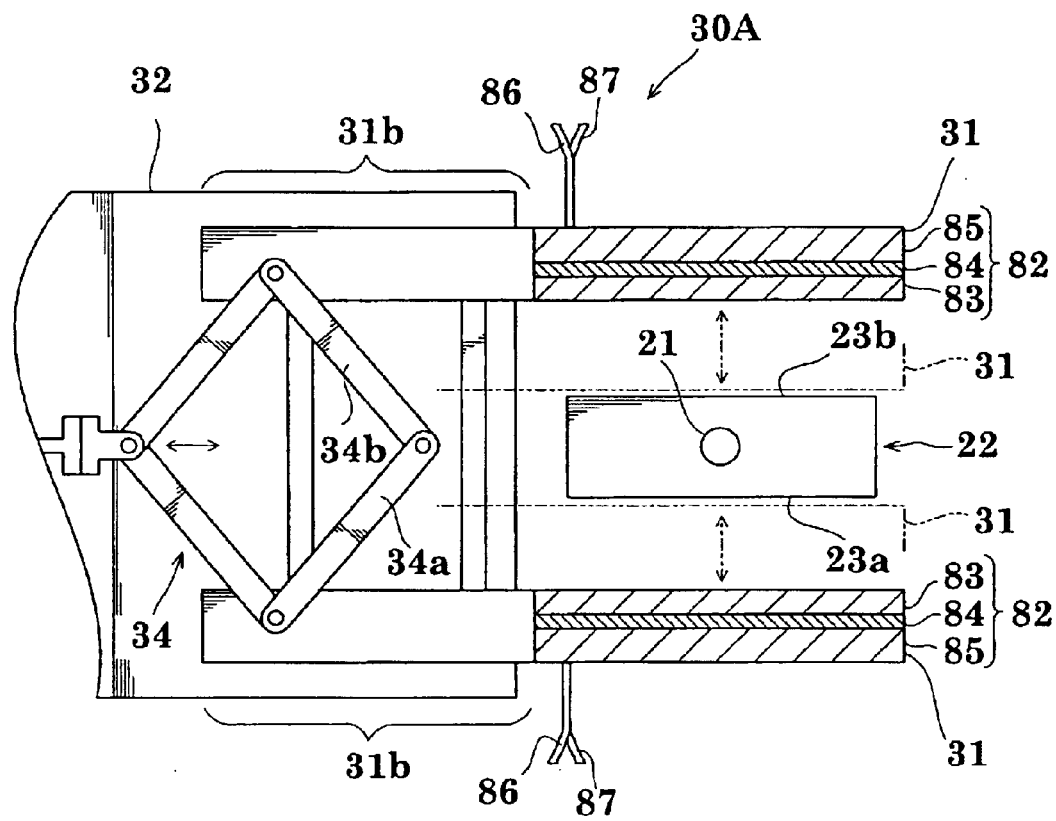
FIG. 17 is a sectional view showing a modified nozzle gripper.
Figure 18:
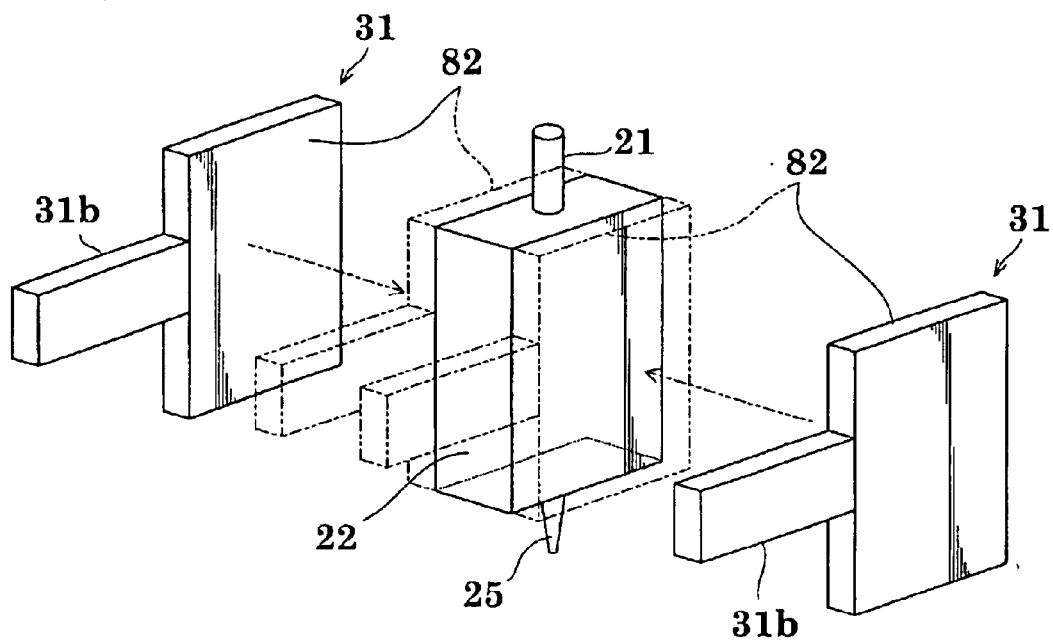
FIG. 18 is an explanatory view illustrating gripping action of the nozzle gripper shown in FIG. 17.

(9) Each of the foregoing embodiments employs the temperature control pot 80 as the temperature control device for controlling the temperature of the treating solution in the treating solution reservoir 22 through heat exchange by pinching the treating solution reservoir 22. Instead of using the temperature control pot 80, as shown in FIG. 17, a pair of gripping arms 31 of a nozzle gripper 30A may have temperature control plates 82, respectively, for pinching the treating solution reservoir 22 therebetween and controlling the temperature of the treating solution in the treating solution reservoir 22 through heat exchange. As in the first embodiment described hereinbefore, each temperature control plate 82 includes a pinching plate 83, a Peltier element 84, a cooling water circulating member 85, a cooling water supply pipe 86 and a cooling water drain pipe 87. As shown in FIG. 18, the pair of gripping arms 31 of the nozzle gripper 30A grip the heat exchange portions (front plate 23a and back plate 23b) of the treating solution reservoir 22 of nozzle 20, and control the temperature of the treating solution in the treating solution reservoir 22 through heat exchange. The nozzle gripper 30A shown in FIGS. 17 and 18 corresponds to the nozzle temperature controlling and moving device of this invention.

In this case, as shown in FIG. 17, the nozzle gripper 30A, while gripping the treating solution reservoir 22, moves the nozzle 20 to the predetermined position over the principal surface of wafer W. This construction dispenses with the temperature control pipe extending along the treating solution pipe as provided in the conventional apparatus, thus requiring only a small treating solution supply system, and providing an effective heat exchange of the treating solution in the treating solution reservoir 22 to control the temperature of the treating solution efficiently.

(10) In each of the foregoing embodiments, heat exchange takes place at the two surfaces (front plate 23a and back plate 23b) of the treating solution reservoir 22. Instead, heat exchange may be effected through all the peripheral surfaces (e.g. left side plate 23e and right side plate 23f formed of a heat conducting material as well as the front plate 23a and back plate 23b) of the treating solution reservoir 22. Where the treating solution reservoirs 22A–22C have a cylindrical periphery as shown in FIG. 14, temperature control may be effected by using temperature control plates having a configuration corresponding to the peripheral configuration of the reservoirs 22A–22C, or through heat conducting members having a configuration corresponding to the peripheral configuration of the reservoirs 22A–22C.

(11) Each of the foregoing embodiments has been described by taking a spin coating apparatus for example. This invention is not limited to such an apparatus, but is applicable also to a non-spin type coating apparatus. The invention is applicable to a wide variety of chemical treating apparatus that perform treatment (e.g. development, cleaning, etc.) of substrates by delivering appropriate treating solutions (e.g. a developer, rinse solution, etc.) to surfaces to be treated of the substrates.

(12) In each of the foregoing embodiments, Peltier elements 84 are used for the temperature control plates 82. Instead, for example, temperature control water may be circulated around the temperature control plates 82.

(13) In the second and third embodiments, the treating solution reservoir 22 of nozzle 20 is moved into the temperature control pot 80. Conversely, to perform the temperature control, the temperature control pot 80 may be moved to a standby location of the treating solution reservoir 22 of a nozzle 20 to be used next.

<Fourth Embodiment>

An embodiment different from the foregoing embodiments will be described, in which the temperature of the treating solution reservoir 22 is controlled through suction, gripping or other means.

Figure 19:
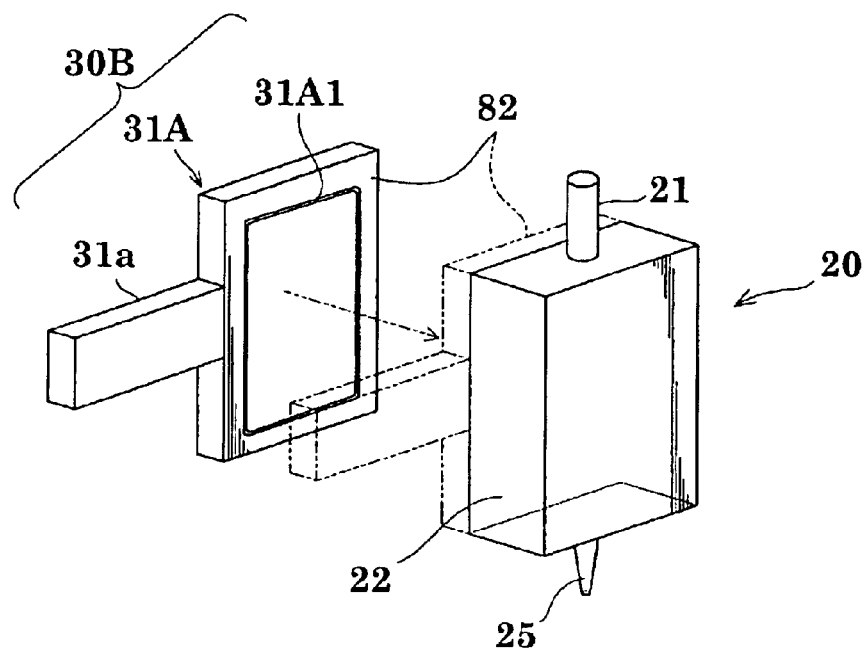
FIG. 19 is a perspective view showing an outline of a holding arm and a nozzle in a spin coating apparatus in a fourth embodiment.

(1) Vacuum Suction:

FIG. 19 refers. FIG. 19 is a perspective view showing an outline of a holding arm and a nozzle in a spin coating apparatus in this embodiment. Like reference numerals are used to identify like parts in the foregoing embodiments and will not particularly be described again.

A nozzle holder 30B includes a holding arm 31A attached to a distal end of an element 31a. The holding arm 31A has the function of the temperature control plates 82 described hereinbefore, and has a suction slit 31A1 formed in the surface thereof for contacting the nozzle 20. The surface of the holding arm 31A (temperature control plate 82) for contacting the nozzle 20 substantially corresponds in size to one of the two large-area portions forming the treating solution reservoir 22 of nozzle 20.

The above nozzle holder 30B corresponds to the nozzle temperature controlling and moving device in this invention.

The nozzle holder 30B, with a suction force applied to the suction slit 31A1 from a vacuum pump or other source of suction not shown, is moved to the nozzle 20 to suck the treating solution reservoir 22 and control the temperature of the treating solution in the reservoir 22.

Thus, also by contacting the large area portion forming part of the treating solution reservoir 22, the temperature of the treating solution in the reservoir 22 is controlled through heat exchange. The temperature-controlled treating solution in the reservoir 22 is delivered to a wafer W for treatment. It is therefore possible to dispense with the temperature control pipe extending along the treating solution pipe as provided in the conventional apparatus, thereby allowing the treating solution supply system to be compact. Moreover, an effective heat exchange of the treating solution in the treating solution reservoir 22 is provided to control the temperature of the treating solution efficiently.

Figure 20:
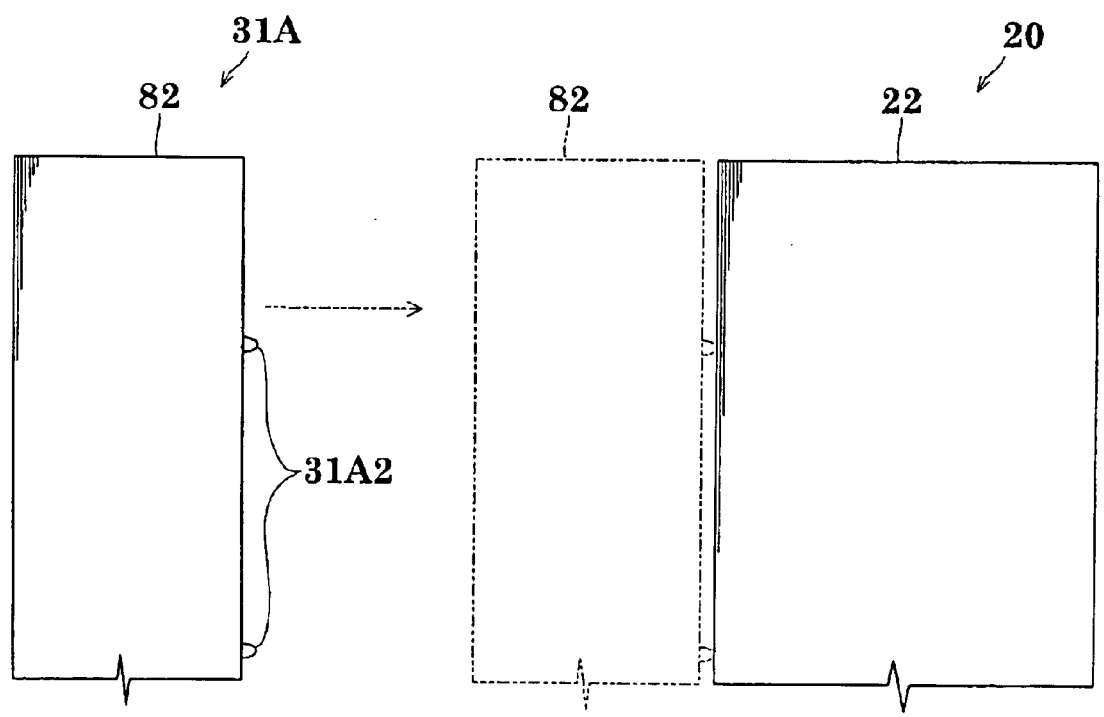
FIG. 20 is an enlarged view showing an example of proximity temperature control.

As shown in FIG. 20, the temperature control plate 82 may have projections 31A2 formed thereon to be slightly spaced from the treating solution reservoir 22 instead of making a face-to-face contact. Temperature control may be effected even with such a slight spacing. Preferably, the projections 31A2 have a height in the order of 0.1 to 0.3 mm, for example. The spacing of this extent is desirable to secure a sufficient temperature control responsibility.

The above projections may be formed on the treating solution reservoir 22 instead of the temperature control plate 82.

Figure 21:
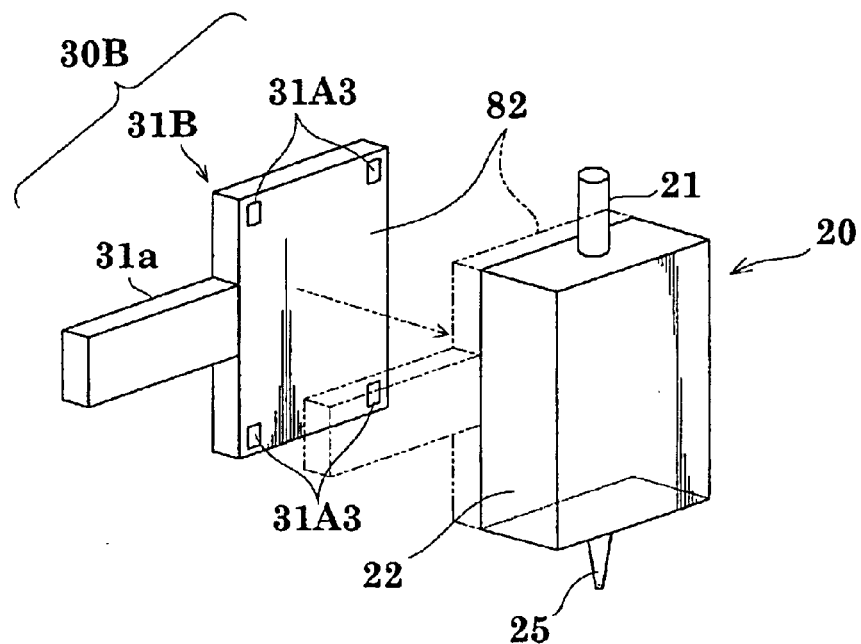
FIG. 21 is a perspective view showing an outline of a modified holding arm and a nozzle.

(2) Magnetic Suction:

FIG. 21 refers. FIG. 21 is a perspective view showing an outline of a modified holding arm and a nozzle in the spin coating apparatus in this embodiment.

In this example, a holding arm 31B has the function of the temperature control plates 82, and includes magnetic field generating elements 31A3 arranged on the surface opposed to the nozzle 20. The field generating elements 31A3 are permanent magnets or electromagnets, for example. In this case, the contacting surface of the treating solution reservoir 22 is formed of a magnetic material. The surface of the holding arm 31B (temperature control plate 82) for contacting the nozzle 20 substantially corresponds in size to one of the two large-area portions forming the treating-solution reservoir 22 of nozzle 20.

The nozzle holder 30B, with a magnetic force generated from the field generating elements 31A3, is moved to the nozzle 20 to suck the treating solution reservoir 22 by magnetism and control the temperature of the treating solution in the reservoir 22.

Figure 22:
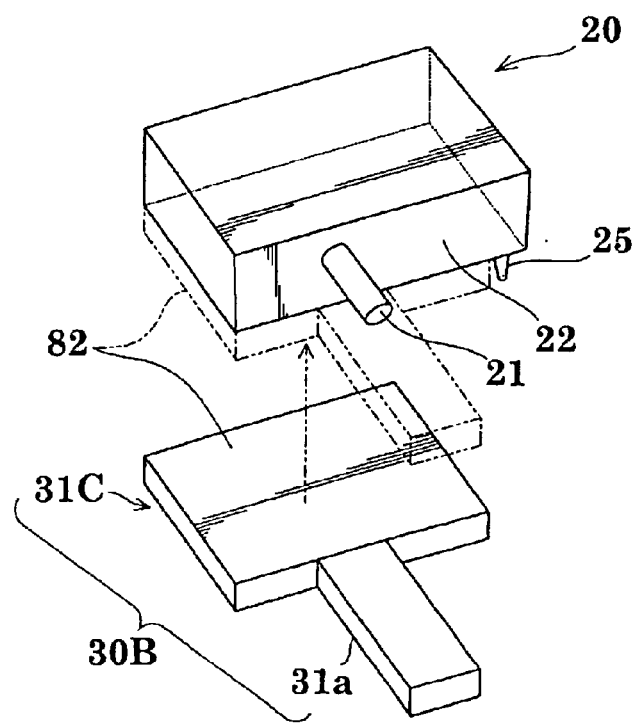
FIG. 22 is a perspective view showing an outline of another modified holding arm and a nozzle.

(3) Scooping:

FIG. 22 refers. FIG. 22 is a perspective view showing an outline of a modified holding arm and a nozzle in the spin coating apparatus in this embodiment.

The nozzle 20 in this embodiment differs from those in the foregoing the embodiments in that the treating solution reservoir 22 is shaped flat (horizontally elongated) and has a projection 25 formed at a corner of a bottom surface thereof. A holding arm 31C includes an upper surface having a large area. Its area is large enough to contact at least a major part of one of the surfaces constituting the treating solution reservoir 22. In order to avoid interference with the projection 25, the temperature control plate 82 of the holding arm 31C has a slightly smaller area than the large-area portion of the treating-solution reservoir 22.

With this construction, the nozzle holder 30B scoops the nozzle 20 from below, and moves the nozzle 20 to a predetermined position while controlling the temperature of nozzle 20.

The temperature control plate 82 may include stoppers for preventing a sideways displacement of the nozzle 20.

Figure 23:
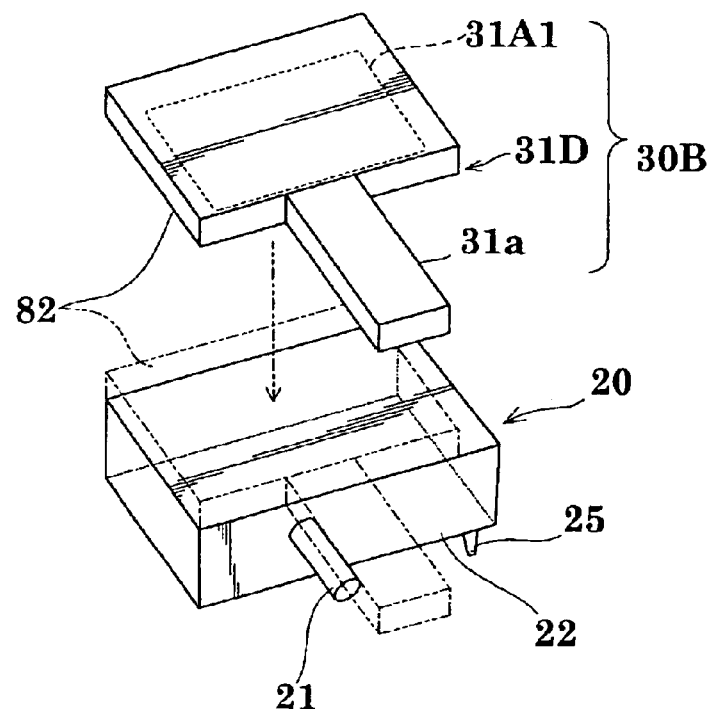
FIG. 23 is a perspective view showing an outline of a further modified holding arm and a nozzle.

(4) Vacuum Suction from Above:

FIG. 23 refers. FIG. 23 is a perspective view showing an outline of a modified holding arm and a nozzle in the spin coating apparatus in this embodiment.

This embodiment corresponds to a combination of the above constructions (1) and (3). That is, a holding arm 31D has a suction slit 31A1, as in the construction (1) above, formed in the undersurface thereof. The nozzle 20 and nozzle holder 30B are similar to those in the construction (3) above, and are exchanged in their vertical relationship.

The nozzle holder 30B, with a suction force applied to the suction slit 31A1, is moved to the nozzle 20 from above to suck the upper surface of the nozzle 20 and move the nozzle 20 to a predetermined position while controlling the temperature of nozzle 20.

Instead of vacuum suction, magnetic suction may be used as in the construction (2) above.

Figure 24:
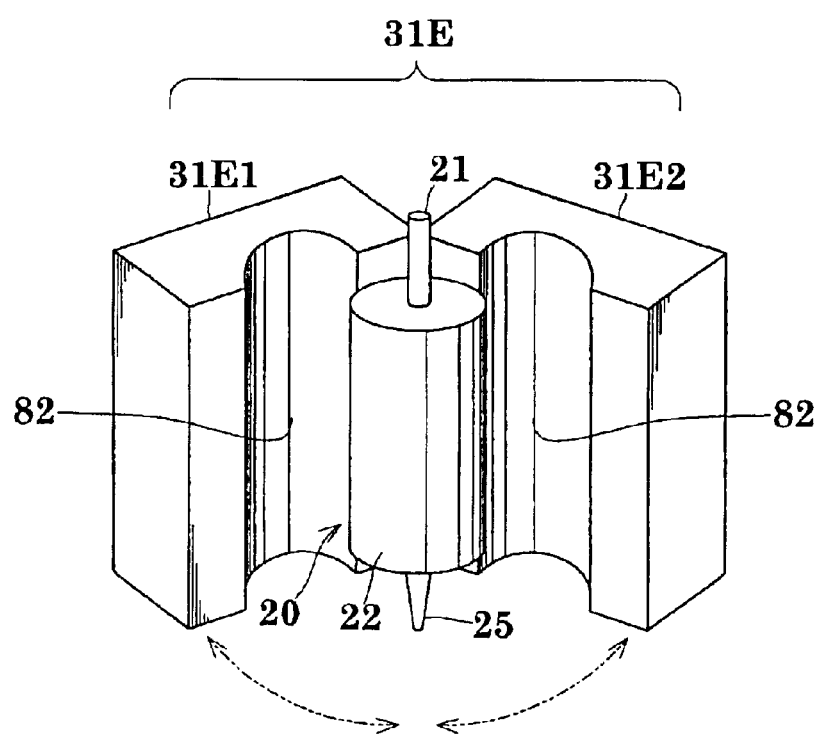
FIG. 24 is a perspective view showing an outline of a further modified holding arm and nozzle.

(5) Hinged Pair:

FIG. 24 refers. FIG. 24 is a perspective view showing an outline of a modified holding arm and a nozzle in the spin coating apparatus in this embodiment.

The nozzle 20 is shaped cylindrical, and includes a projection 25 formed on the undersurface thereof. A holding arm 31E includes a pair of arm members 31E1 and 31E2, with temperature control plates 82 mounted inside and defining a bore of slightly larger diameter than a minor-axis outside diameter of the nozzle 20. The pair of arm members 31E1 and 31E2 are hinged together for opening and closing relative to each other.

With this construction, the pair of arm members 31E1 and 31E2 are opened, moved toward the nozzle 20, and closed to hold the nozzle 20 therein and control the temperature of the treating solution.

The temperature control plates 82 need not surround the entire peripheral surface of the nozzle 20, but may surround a large part thereof.

Figure 25:
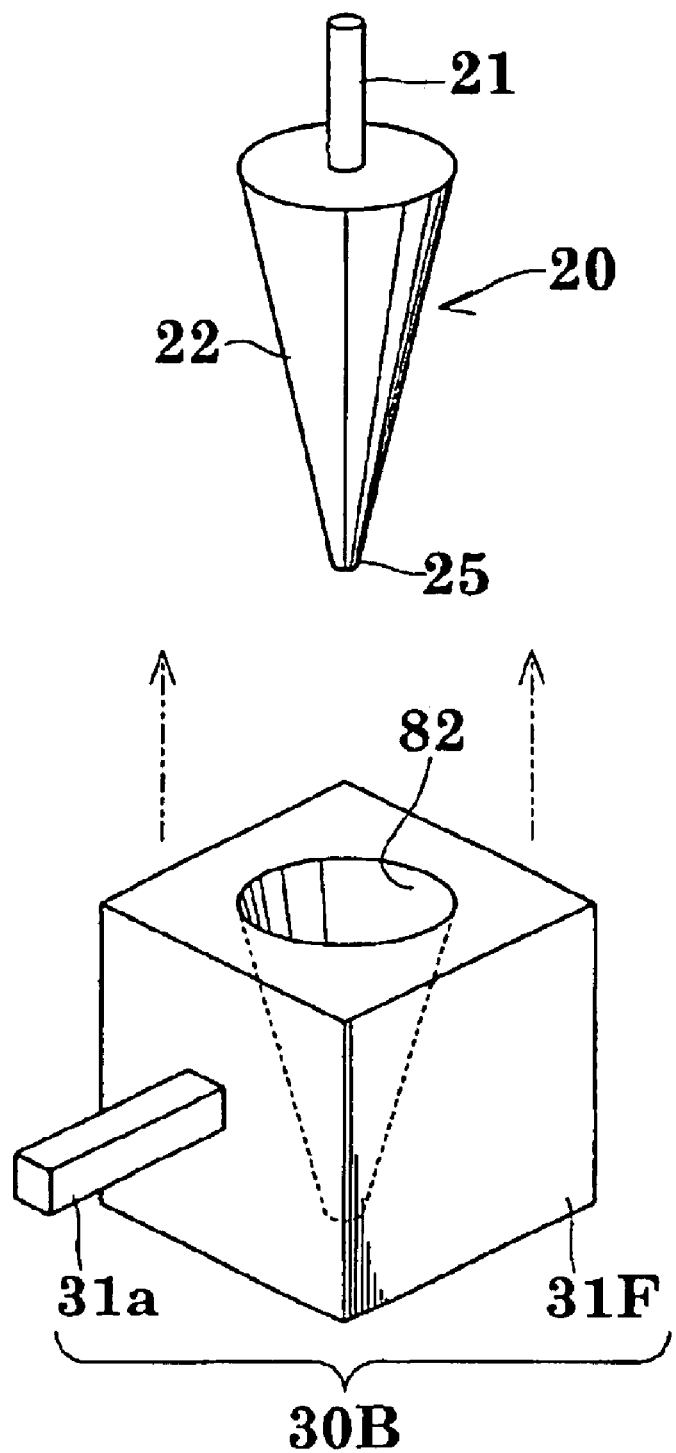
FIG. 25 is a perspective view showing an outline of a further modified holding arm and nozzle.

(6) Stop Type:

FIG. 25 refers. FIG. 25 is a perspective view showing an outline of a modified holding arm and a nozzle in the spin coating apparatus in this embodiment.

The nozzle 20 including a treating solution reservoir 22 has a shape of an inverted cone defining a projection 25 at the lower end thereof. A holding arm 31F is box-shaped, and includes a temperature control plate 82 formed centrally of an upper surface thereof and extending downward in the shape of an inverted cone slightly larger than the outer configuration of nozzle 20. The temperature control plate 82 has an opening formed at the lower end thereof for receiving the projection 25 of nozzle 20.

With this construction, the holding arm 31F is positioned under the nozzle 20. As the holding arm 31F is raised, the temperature control plate 82 engages the nozzle 20. In this way, the holding arm 31F moves the nozzle 20 to a predetermined position while controlling the temperature of the treating solution in the nozzle 20.

This invention is not limited to the fourth embodiment described above, but may be modified as follows.

Instead of using the holding arm with the temperature control function, a pot having this function may be provided. A temperature control plate 82 in the port may be placed in contact with or adjacent at least a major part of one of the surfaces forming the treating solution reservoir 22, rather than pinching the entire treating solution reservoir 22.

Such a construction produces a temperature control effect similar to the case of using the holding arm having the temperature control function as described above.

This invention may be embodied in other specific forms without departing from the spirit or essential attributes thereof and, accordingly, reference should be made to the appended claims, rather than to the foregoing specification, as indicating the scope of the invention.

What is claimed is:

1. A chemical treating apparatus for performing a predetermined treatment of a principal surface of a substrate by delivering a treating solution thereto, said apparatus comprising:

a treating solution delivery nozzle for delivering the treating solution supplied through a treating solution pipe to the principal surface of the substrate; a treating solution reservoir disposed adjacent a tip end of said treating solution delivery nozzle for storing the treating solution; and temperature control means movable away from said treating solution reservoir for holding said treating solution reservoir during a time of temperature control to control temperature of the treating solution in said treating solution reservoir through heat exchange with the treating solution.

2. An apparatus as defined in claim 1, wherein said temperature control means comprises a temperature control container for receiving said treating solution delivery nozzle, and holding said treating solution reservoir to control temperature of the treating solution in said treating solution reservoir through heat exchange with the treating solution.

3. An apparatus as defined in claim 1, wherein said temperature control means comprises nozzle temperature controlling and moving means for holding said treating solution reservoir to control temperature of the treating solution in said treating solution reservoir through heat exchange with the treating solution, and for moving said treating solution delivery nozzle to a predetermined position over the principal surface of the substrate while holding said treating solution reservoir.

4. An apparatus as defined in claim 2, further comprising:

nozzle moving means for moving said treating solution delivery nozzle to a predetermined position over the principal surface of the substrate;

wherein said treating solution delivery nozzle has an engageable portion disposed in a position other than heat exchange portions of said treating solution reservoir held by said temperature control container, a heat insulating member being provided between the heat exchange portions and the engageable portion or on the engageable portion.

5. An apparatus as defined in claim 2, further comprising:

nozzle moving means having a holder for gripping said treating solution reservoir, said nozzle moving means moving said treating solution delivery nozzle to a predetermined position over the principal surface of the substrate, with said holder gripping said treating solution reservoir; and a holder temperature control container provided separately from said temperature control container for receiving said holder and controlling temperature of said holder.

6. An apparatus as defined in claim 1, wherein said treating solution reservoir is shaped to have a large surface area per volume.

7. An apparatus as defined in claim 1, wherein said treating solution reservoir is sized to store the treating solution in a quantity to be used in a next delivery cycle.

8. An apparatus as defined in claim 2, wherein said treating solution reservoir is sized to store the treating solution in a quantity to be used in a next delivery cycle.

9. An apparatus as defined in claim 1, wherein said treating solution reservoir comprises a channel for directing the treating solution to a lower position, then to an upper position higher than the lower position, and again downward to be delivered from a discharge opening.

10. An apparatus as defined in claim 2, wherein said treating solution reservoir comprises a channel for directing the treating solution to a lower position, then to an upper position higher than the lower position, and again downward to be delivered from a discharge opening.

11. A chemical treating apparatus for performing a predetermined treatment of a principal surface of a substrate by delivering a treating solution thereto, said apparatus comprising:

a treating solution delivery nozzle for delivering the treating solution, supplied through a treating solution pipe, to the principal surface of the substrate; a treating solution reservoir disposed adjacent a tip end of said treating solution delivery nozzle for storing the treating solution; and temperature control means movable away from said treating solution reservoir for contacting or approaching at least a major part of one of surfaces defining said treating solution reservoir during a time of temperature control to control temperature of the treating solution in said treating solution reservoir through heat exchange with the treating solution.

12. An apparatus as defined in claim 11, wherein said temperature control means comprises a temperature control container for receiving said treating solution delivery nozzle to control temperature of the treating solution in said treating solution reservoir.

13. An apparatus as defined in claim 11, wherein said temperature control means comprises nozzle temperature controlling and moving means for moving said treating solution delivery nozzle to a predetermined position over the principal surface of the substrate while holding said treating solution reservoir.

14. An apparatus as defined in claim 13, wherein said nozzle temperature controlling and moving means is arranged to hold said treating solution reservoir by vacuum suction.

15. An apparatus as defined in claim 13, wherein said nozzle temperature controlling and moving means is arranged to hold said treating solution reservoir by magnetism.

16. An apparatus as defined in claim 13, wherein said nozzle temperature controlling and moving means is arranged to hold said treating solution reservoir by scooping action.

17. An apparatus as defined in claim 13, wherein said nozzle temperature controlling and moving means is arranged to hold said treating solution reservoir by attracting said treating solution reservoir upward by magnetism.

18. An apparatus as defined in claim 13, wherein said treating solution reservoir has a shape of an inverted cone, said nozzle temperature controlling and moving means being arranged to hold said treating solution reservoir in an opening shaped to fit on the inverted cone.

19. An apparatus as defined in claim 13, wherein said nozzle temperature controlling and moving means includes two hinged parts for opening and closing relative to each other to hold said treating solution reservoir.

20. An apparatus as defined in claim 11, wherein a temperature-controlled portion of said treating solution reservoir or a temperature-controlling portion of said temperature control means has projections formed thereon.

* * * * *